United States Patent
Sun et al.

(10) Patent No.: US 11,119,416 B2
(45) Date of Patent: Sep. 14, 2021

(54) METHOD FOR FORMING SEMICONDUCTOR STRUCTURE AND OVERLAY ERROR ESTIMATION

(71) Applicant: TAIWAN SEMICONDUCTOR MANUFACTURING CO., LTD., Hsinchu (TW)

(72) Inventors: Che-Yuan Sun, Hualien County (TW); Yen-Liang Chen, Hsinchu County (TW); He Fan, New Taipei (TW); Yen-Hung Chen, Hsinchu County (TW); Kai Lin, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 135 days.

(21) Appl. No.: 16/439,546

(22) Filed: Jun. 12, 2019

(65) Prior Publication Data
US 2020/0057388 A1  Feb. 20, 2020

Related U.S. Application Data

(60) Provisional application No. 62/718,933, filed on Aug. 14, 2018.

(51) Int. Cl.
*G03F 7/20* (2006.01)

(52) U.S. Cl.
CPC ........ *G03F 7/70633* (2013.01); *G03F 7/7065* (2013.01); *G03F 7/70625* (2013.01)

(58) Field of Classification Search
CPC ............ G03F 7/70633; G03F 7/2037; G03F 7/70466; G03F 7/7065; G03F 7/70625; H01L 22/12; H01L 23/544; H01L 21/0277; H01L 22/20; H01L 22/34; H01L 21/31144
See application file for complete search history.

(56) References Cited

U.S. PATENT DOCUMENTS

| 2007/0292771 A1 | 12/2007 | Ke et al. |
| 2013/0147066 A1 | 6/2013 | Cheng et al. |
| 2015/0067617 A1 | 3/2015 | Chang et al. |
| 2019/0178639 A1* | 6/2019 | Gutman .................. H01J 37/28 |

* cited by examiner

*Primary Examiner* — Mesfin T Asfaw
(74) *Attorney, Agent, or Firm* — Maschoff Brennan

(57) ABSTRACT

A method includes forming a first overlay feature in a first dielectric layer over a first wafer; forming a second dielectric layer over the first overlay feature and the first dielectric layer; forming an opening in the second dielectric layer by at least using an exposure tool; forming a second overlay feature in the opening of the second dielectric layer, such that a first edge of the first overlay feature is covered by the second dielectric layer; directing an electron beam to the first and second overlay features and the second dielectric layer; detecting the electron beam reflected from the first overlay feature through the second dielectric layer and from the second overlay feature by a detector; obtaining, by a controller, an overlay error between the first overlay feature and the second overlay feature according to the reflected electron beam electrically connected to the detector.

20 Claims, 29 Drawing Sheets

METHOD FOR FORMING SEMICONDUCTOR STRUCTURE AND OVERLAY ERROR ESTIMATION

PRIORITY CLAIM AND CROSS-REFERENCE

This application claims priority to U.S. Provisional Application Ser. No. 62/718,933, filed Aug. 14, 2018, which is herein incorporated by reference.

BACKGROUND

Semiconductor integrated circuit (IC) fabrication involves forming multiple material layers with designed patterns on a semiconductor wafer. Each layer has to be aligned with previous layers such that the formed circuit can function properly. Various marks are used for this purpose. For example, overlay marks are used to monitor overlay deviation between the layers on the wafer. As semiconductor technology continues progressing to circuit layouts having smaller feature sizes, the alignment requirement becomes more stringent and the overlay marks are expected to take less wafer area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
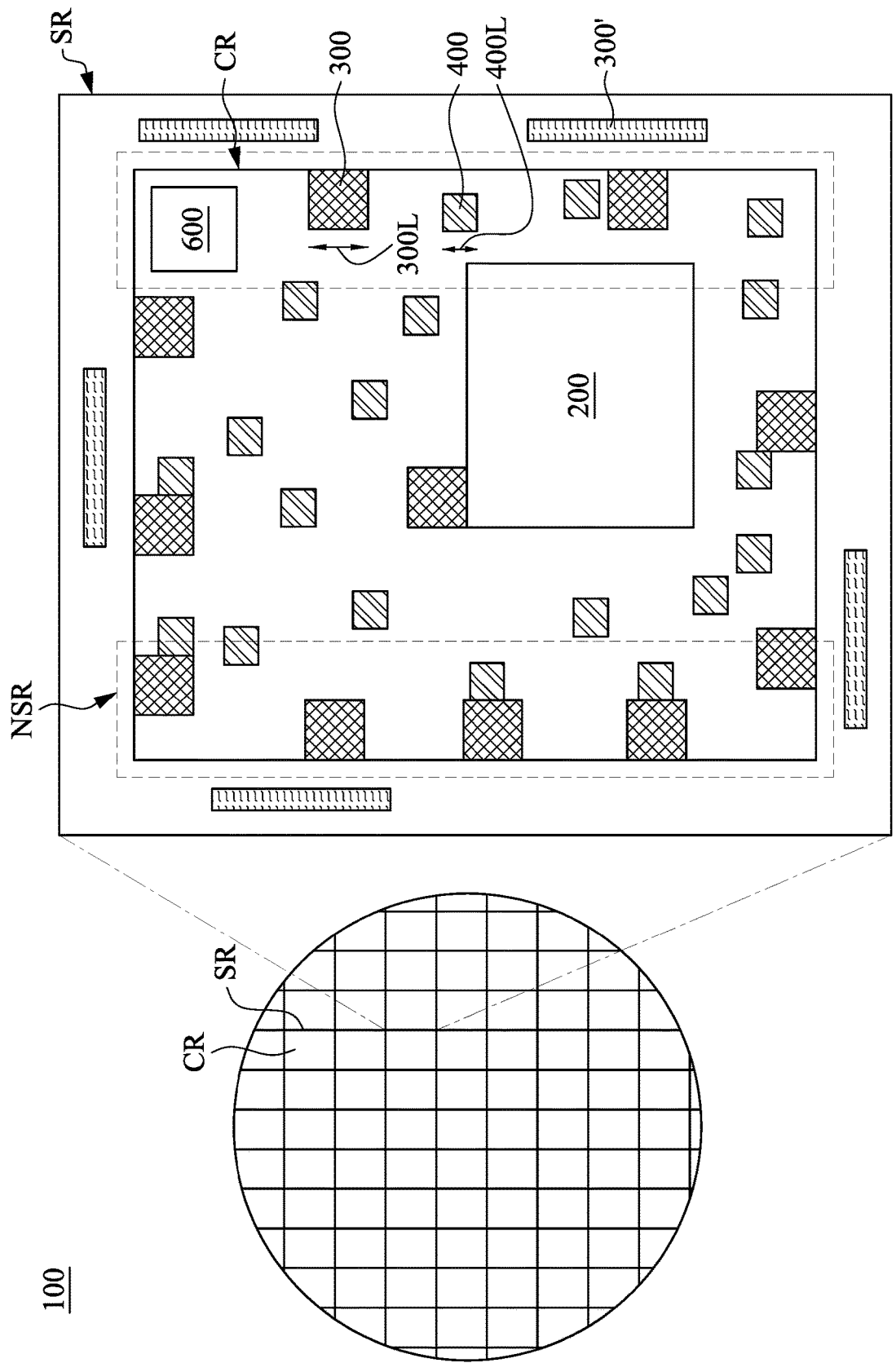
FIG. 1 is a schematic top view of a wafer according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a schematic top view of a wafer 100 according to some embodiments of the present disclosure. The wafer 100 includes plural chip regions CR and plural scribe line regions SR separating the chip regions CR from each other. A device 200 (e.g., circuits or interconnect structures), optical overlay marks 300, electron-based overlay marks 400, and an electron-based reference mark 600 are located at various locations in the chip regions CR. In some embodiments, the device 200 may include various devices or elements, such as a static random-access memory (SRAM) cells, transistors, resistors, capacitors, diodes, fuses, etc., but is simplified for a better understanding of the concepts of the present disclosure. The optical overlay marks 300 and the electron-based overlay marks 400 are used for optical and electron-beam based overlay measurements, respectively. In some embodiments, test lines 300' are located in the scribe line region SR, and may be used in the optical based overlay measurement. The electron-based overlay marks 400 may be disposed adjacent to the optical overlay marks 300 or the test line 300', such that some of the marks 300 (or the test line 300') and the marks 400 may be used for indicating optical-based or electron-based overlay errors at the same position. With this configuration, the optical based overlay measurement result of the marks 300 or the test line 300' can be compared with and checked by the electron-beam based overlay measurement result of the corresponding marks 400, such that one of the marks 300 or the test line 300' having similar measurement result with that of the corresponding mark 400 is believed to have less mark damage and selected for the process of next wafers. The electron-based reference mark 600 is used for providing a model for determining overlay errors in the electron-beam based overlay measurement.

Figure 2A:
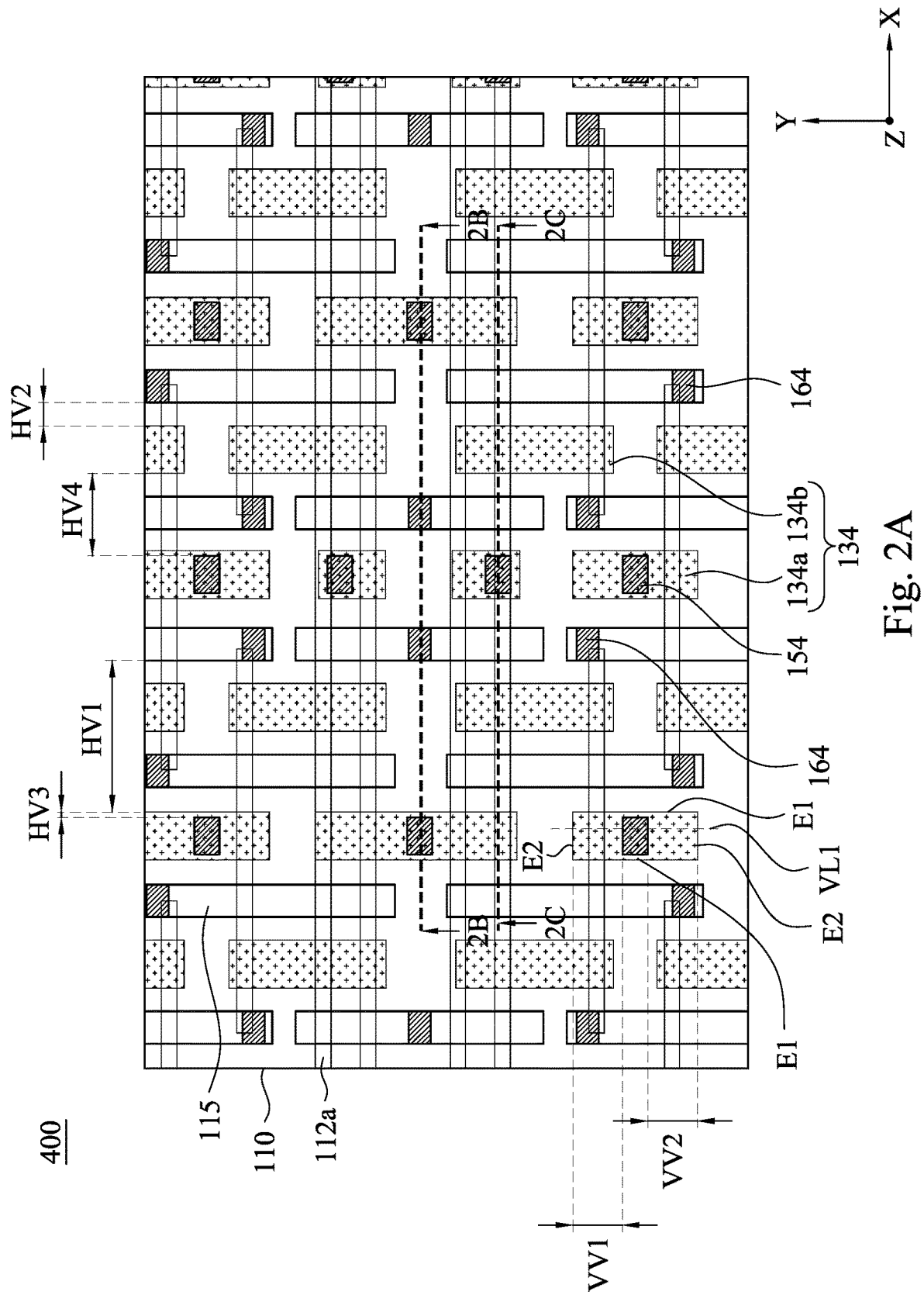
FIG. 2A is a top view of an electron-based overlay mark according to some embodiments of the present disclosure.

FIG. 2A is a top view of an electron-based overlay mark 400 of FIG. 1 according to some embodiments of the present disclosure. A pre-layer structure 110 including fins 112a and gate structures 115 is provided, and the electron-based overlay mark 400 may include first overlay features 134 (marked with cross pattern) and second overlay features 154 and 164 (mark with slash pattern) over the pre-layer structure 110. In some embodiments, the first overlay feature 134 represents the pattern of a first layer, the second overlay features 154 and 164 represent the pattern of a second layer over the first layer. In some embodiments, the feature 134, 154, and 164 may serve as source/drain contacts, source/drain contact vias, and gate contacts, respectively. In some embodiments, as shown in FIG. 2A, the first overlay features 134 has the edges E1 and E2 extending along the directions X and Y, respectively. The edges E1 and E2 of the features 134 are not fully covered by the second overlay features 154 and 164, such that the edges E1 and E2 may be inspected by suitable methods. For better illustration, in this context, the first overlay features 134 under the second overlay features 154 are denoted as the overlay features 134a, while the first overlay features 134 not under the second overlay features 154 are denoted as the overlay features 134b.

Figure 2B:
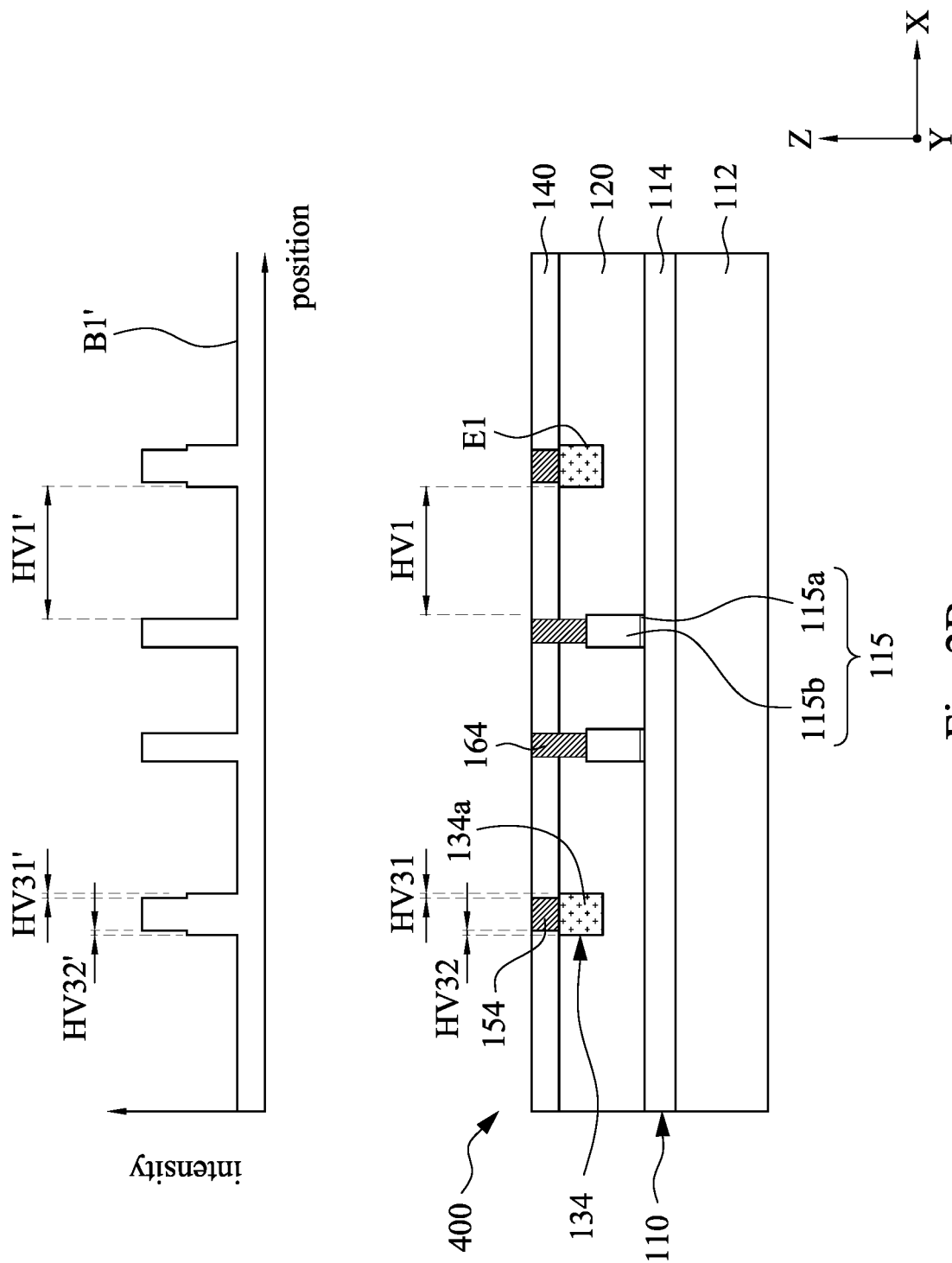
FIG. 2B shows a cross-sectional view of the electron-based overlay mark taken along line 2B-2B of FIG. 2A and a detected result thereof.
Figure 2C:
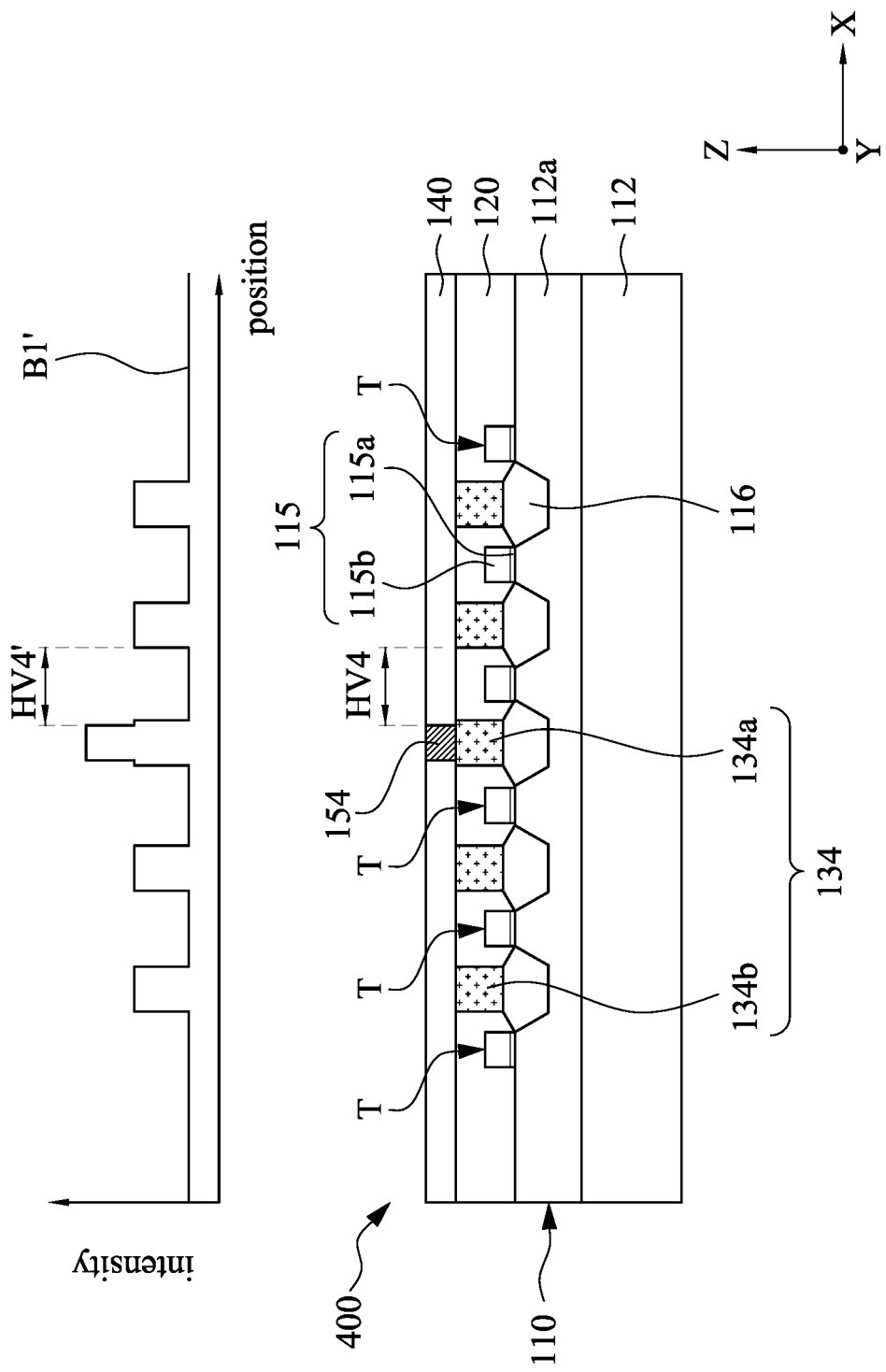
FIG. 2C shows a cross-sectional view of the electron-based overlay mark taken along line 2C-2C of FIG. 2A and a detected result thereof.

FIGS. 2B and 2C show cross-sectional views of the electron-based overlay mark 400 taken along lines 2B-2B and 2C-2C of FIG. 2A and the corresponding detected results, respectively. The pre-layer structure 110 includes a substrate 112 having the fins 112a (referring to FIG. 2C), isolation dielectrics 114 (referring to FIG. 2B), the gate structures 115, and epitaxial source/drain features 116 (referring to FIG. 2C). The fins 112a, the gate structures 115, and the epitaxial source/drain features 116 forms plural transistors T, in which for the electron-based overlay mark 400, the transistors T are dummy. To be specific, the transistors T of the electron-based overlay mark 400 are not connected to an external circuit when Wafer Acceptance Test (WAT) is performed.

In some embodiments, the substrate 112 may be a semiconductor substrate, such as a bulk semiconductor, a semiconductor-on-insulator (SOI) substrate, or the like. The substrate 112 may be a wafer, such as a silicon wafer. In some embodiments, the semiconductor material of the substrate 112 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 112 is etched to form at least one semiconductor fin 112a (referring to FIG. 2C). In some embodiments, plural semiconductor fins 112a are substantially parallel to each other. At least one isolation dielectric 114 (referring to FIG. 2B) are formed between the semiconductor fins 112a so as to separate the semiconductor fins 112a from each other. In some embodiments, the isolation dielectric 114 is made of silicon oxide, silicon nitride, silicon oxynitride, fluoride-doped silicate glass (FSG), or other low-K dielectric materials. In some embodiments, the isolation dielectric 114 can have a multi-layer structure, for example, a thermal oxide liner layer with silicon nitride formed over the liner. Herein, a top surface of the semiconductor fins 112a is higher than a top surface of the isolation dielectrics 114, such that the semiconductor fins 112a protrude above the isolation dielectrics 114.

The gate structures 115 wrap the semiconductor fins 112a and are respectively formed over channel regions in the substrate 112 (e.g., the fin 112a). The gate structures 115 have substantially parallel longitudinal axes that are substantially perpendicular to longitudinal axes of the semiconductor fins 112a. For example, herein, the fins 112a extending along the direction X, and the gate structures 115 extending along the direction Y, which is not parallel with the direction X. For example, herein, the direction Y is orthogonal to the direction X.

Each of the gate structures 115 may include a gate dielectric 115a and a gate electrode 115b. In some embodiments, the gate dielectric 115a may include an oxide layer and a high-k dielectric layer over the oxide layer. The high-k dielectric layer may include metal oxides, transition metal-oxides, or the like. Examples of the high-k dielectric material include, but are not limited to, hafnium oxide ($HfO_2$), hafnium silicon oxide (HfSiO), hafnium tantalum oxide (HMO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

The gate electrode 115b may be a metal gate, although it may also be formed of polysilicon, metal silicides, or the like. For example, the gate electrode 115b may include a work function metal layer and a fill metal. In some embodiments, the work function conductive layer of the gate electrode 115b may include one or more n-type work function metals (N-metal) for forming an n-type transistor on the substrate 112. The n-type work function metals may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. In alternative embodiments, the work function conductive layer may include one or more p-type work function metals (P-metal) for forming a p-type transistor on the substrate 112. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. The conductive layer of the gate electrode 115b may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

The epitaxial source/drain features 116 (referring to FIG. 2C) are over portions of the fins 112a uncovered by the gate structures 115. The epitaxial source/drain features 116 may be Si features, SiGe features, silicon phosphate (SiP) features, silicon carbide (SiC) features and/or other suitable features, which can be formed in a crystalline state. In some embodiments, lattice constants of the epitaxial source/drain features 116 are different from that of the semiconductor fins 112a, so that the channel region between the epitaxial source/drain features 116 can be strained or stressed by the epitaxial source/drain features 116 to improve carrier mobility of the semiconductor device and enhance the device performance.

An ILD layer 120 is formed over the pre-layer structure 110, the gate structures 115, and the epitaxial source/drain features 116. In some embodiments, the ILD layer 120 is formed over the pre-layer structure 110 along a direction Z, which is defined in a direction perpendicular to both directions X and Y. The first overlay features 134 are in the ILD layer 120 and serve as source/drain contacts as aforementioned. In some embodiments, an ILD layer 140 is formed over the ILD layer 120 along the direction Z. In some embodiments, the ILD layer 140 may cover portions of the first overlay features 134, e.g., edges E1 and E2 of the first overlay features 134. The second overlay features 154 are in the ILD layer 140 and serve as conductive vias connected to the source/drain contacts as aforementioned. The overlay features 164 are in the ILD layers 120 and 140 and serve as gate contacts as aforementioned.

Figure 7:
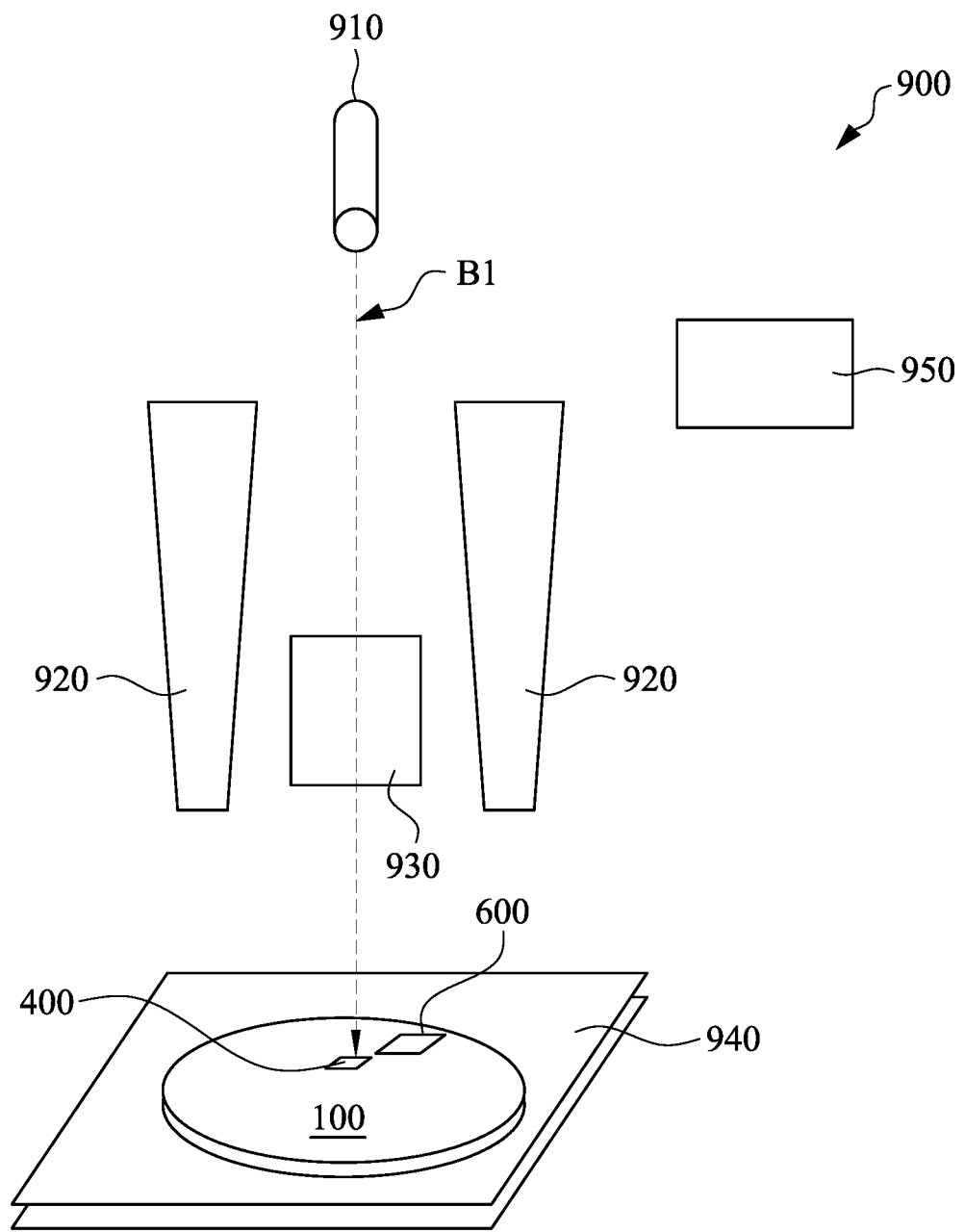
FIG. 7 is a schematic view of an electron-based system according to some embodiments of the present disclosure.

Herein, overlay conditions between the overlay features 134a and 164, between the overlay features 134a and 154, between the overlay features 134b and 164, and between the overlay features 134b and 154 are measured by an electron-based system 900 in FIG. 7, and an electron-based image including position information of the overlay features 134, 154, and 164 may be obtained. To be specific, an electron beam (e.g., the electron beam B1 generated by the electron-based system 900 in FIG. 7) is incident onto the wafer 100, and an overlay signal (e.g., electron beam B1') reflected by the wafer 100 is detected as shown in FIGS. 2B and 2C, thereby obtaining the electron-based image.

In some cases where the electron beam has a low landing energy, however, the ILD layer (e.g., the ILD layer 140) covering the first overlay features 134 may obstruct the propagation of the electron beam, such that the electron beam attacks the first overlay features 134 with little intensity, and the intensity of the electron beam reflected by the first overlay features 135 may be too weak to be detected or recognized. In the cases, due to the coverage of the ILD layer, the pattern of first layer may not be detected by using the electron beam.

In the present embodiments, the electron beam B1 is adjusted to have a high landing energy such that while a first portion of the electron beam B1 may be reflected by the pattern of the second layer (e.g., the second overlay feature 154 and 164 of the mark 400), and a second portion of the electron beam B1 may penetrate the ILD layer 140 and be reflected by the pattern of the first layer (e.g., the first overlay features 134 of the mark 400) through the ILD layer 140. As shown in FIGS. 2B and 2C, a first portion of the reflected electron beam B1' corresponding to the features 154 and 164 have a strong intensity, while a second portion of the reflected electron beam B1' corresponding to the features 134 have an intensity less than that of the first portion of the reflected electron beam B1', but detectable and recognizable. For example, in the present embodiments, the electron-based system 900 is adjusted to (referring to FIG. 7) operates at a landing voltage in a range from about 5 kV to about 45 kV, and the electron beam B1 may have a landing energy in a range from about 5 keV to about 45 keV. The electron beam B1 with the high landing energy may partially penetrate the ILD layer 140 and be reflected by the first overlay features 134 through the ILD layer 140, rather than almost all shielded by the ILD layer 140. In some embodiments, the electron-based system 900 in FIG. 7 may use the electron beams B1 to scan an area of the wafer 100 (referring to FIG. 1), such that a see-through electron-based image including information of the first overlay features 134 and the second overlay features 154 and 164 of a portion of the mark 400 is captured. For example, the area scanned by the electron beams B1 may be several micrometers, such as about 1 micrometers, in which the scanned area may be less than an area of the electron-beam marks 400.

In some embodiments, the electron beams B1 can cause damages to the materials under inspection due to its relatively high energy. In some embodiments, it is arranged that the electron beams B1 is directed to the electron-beam marks 400 but not to the device 200 in FIG. 1, such that the device 200 remains intact after the electron-based inspection, while the ILD layers in the region of the electron-beam marks 400 may be damaged.

Herein, the first portion of the electron beam B1' reflected by the second overlay features 154 and 164 of the mark 400 (which does not pass through the ILD layer 140) may have an intensity greater than that of the second portion of the electron beam B1' reflected by the first overlay features 134 (which passes through the ILD layer 140). The intensity difference reveals the positions of the overlay features of different layers, and the overlay condition thereof may be measured.

In some embodiments, as shown in FIG. 2A, the pattern of the first layer (e.g., the first overlay features 134) and the pattern of the second layer (e.g., the second overlay features 154 and 164) are designed such that a horizontal overlay condition and a vertical overlay condition can be measured using one electron-based image. To be specific, in some embodiments, for detecting the horizontal overlay condition, at least a portion of the pattern of the first layer (e.g., the first overlay features 134) and at least a portion of the pattern of the second layer (e.g., the second overlay features 154 and 164) are located on a horizontal line (e.g., one of the lines 2B-2B and 2C-2C). Furthermore, at least one edge of the pattern of the first layer (e.g., the edge E1 of the first overlay features 134) is not covered by the pattern of the second layer (e.g., the second overlay features 154 and 164) in the horizontal direction X. Through the configuration, the horizontal overlay condition can be measured using one electron-based image. For example, referring to FIGS. 2B and 2C, the offset HV1' of the electron beam Br in the electron-based image reveals a horizontal offset value HV1 between the features 134a and 164. The offsets HV31' and HV32' of the electron beam Br in the electron-based image reveals horizontal offset values HV31 and HV32 between the features 134a and 154. The offset HV4' of the electron beam B1' in the electron-based image reveals a horizontal offset value HV4 between the features 134b and 154. Similarly, a horizontal offset value HV2 between the features 134b and 164 may be inferred from the electron beam B1' in the electron-based image.

Similarly, referring back to FIG. 2A, for detecting the vertical overlay condition, some of the first overlay features 134 and the second overlay features 154 are located on a vertical line (e.g., vertical line VL1), and at least one edge E2 of the first overlay features 134 is not covered by the second overlay features 154 in the vertical direction Y. Through the configuration, the vertical overlay condition may be measured using the electron-based image. For example, vertical offset values VV1 and VV2 between the features 134a and 154 may be obtained from the electron-based image.

In the present embodiments, some of the first overlay features 134 are in contact with the second overlay features 154. However, it should not limit the scope of the present embodiments, and in some other embodiments, other dielectric layers may be interposed between the first overlay features 134 and the second overlay features 154. Through the configuration, during the overlay measurements, the first portion of the electron beam B1 may be reflected by the second overlay features 154 and 164, the second portion of the electron beam B1 may penetrate the ILD layer 140 and the other dielectric layers, and then be reflected by the first overlay features 134 through the ILD layer 140 and the other dielectric layers. It is noted that the electron-beam based overlay measurements may also be used in detecting the overlay conditions of other features. For example, the electron-beam based overlay measurements may also be used in detecting the overlay conditions between the fins 112a and the gate structures 115, the fins 112a and the epitaxial source/drain features 116, and the gate structures 115 and the epitaxial source/drain features 116.

Figure 3:
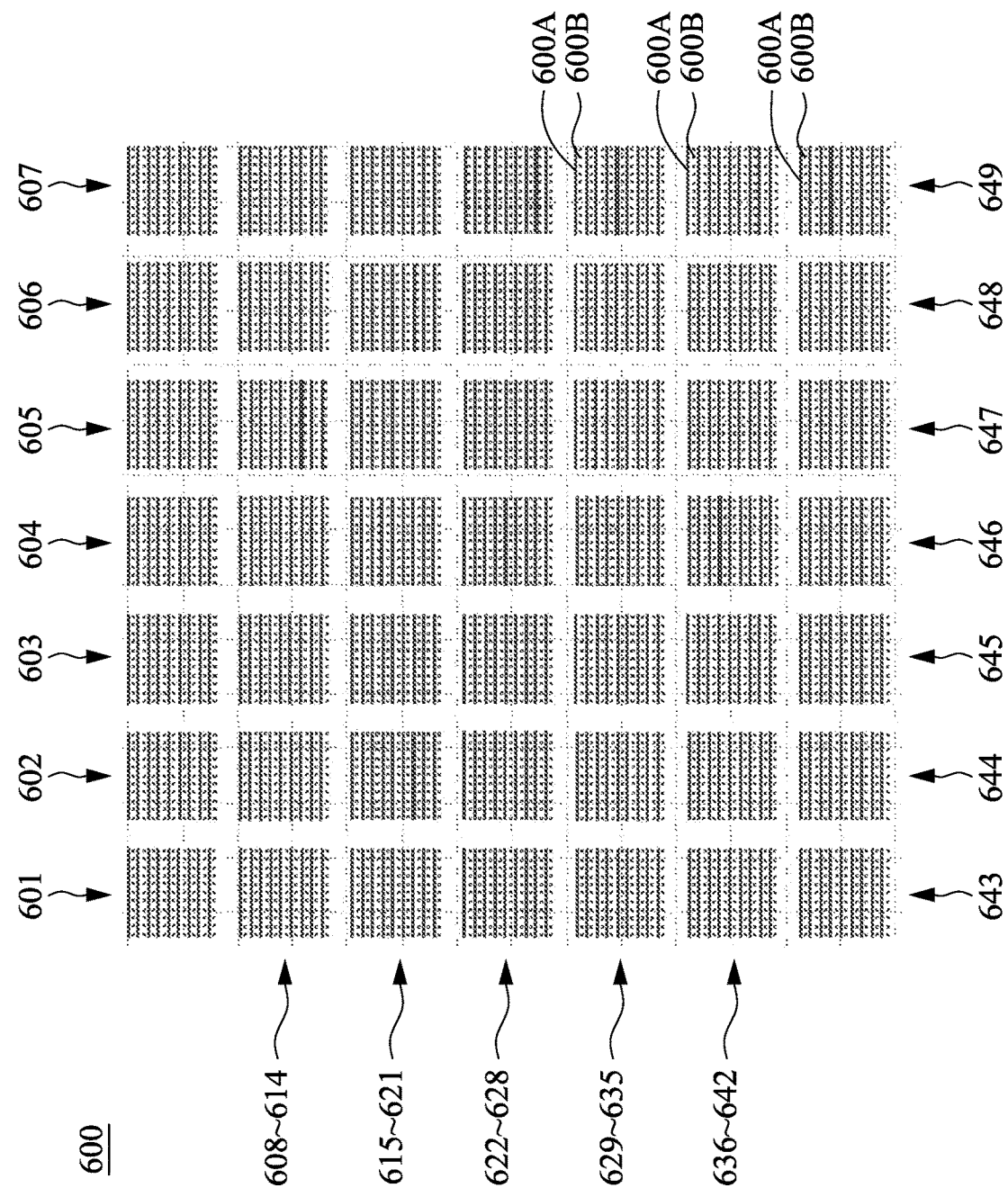
FIG. 3 is a top view of an electron-based reference mark according to some embodiments of the present disclosure.

FIG. 3 is a top view of an electron-based reference mark 600 of FIG. 1 according to some embodiments of the present disclosure. In some embodiments, the electron-based reference mark 600 includes plural sub-marks 601-649 arrayed in the chip region CR (referring to FIG. 1). The sub-marks 601-649 having various configurations and correspond with various overlay errors, respectively. For example, each of the sub-marks 601-649 includes a pattern of the first layer (e.g., the first reference features 600A) and a pattern of the second layer (e.g., the second reference features 600B). To be specific, the features 600A is in the ILD layer 120 (referring to FIGS. 2B-2C), and the feature 600B is in the ILD layer 140 or in both the ILD layers 120 and 140 (referring to FIGS. 2B-2C). The features 600A may be formed by the formation process of the features 134. The features 600B may be formed by the formation process of the features 154/164. The configurations of the sub-marks 601-649 may be different from each other, for example, in the sub-marks 601-649, the distances between the features 600A and 600B are different from each other. Thus, the sub-marks 601-649 are associated with various and/or theoretical different overlay errors. In some embodiments, the respective theoretical overlay errors of the sub-marks 601-649 are determined and known in advanced. For example, a datasheet including plural reference theoretical overlay errors respectively corresponding to the sub-marks 601-649 may be obtained by a controller.

Figure 4:
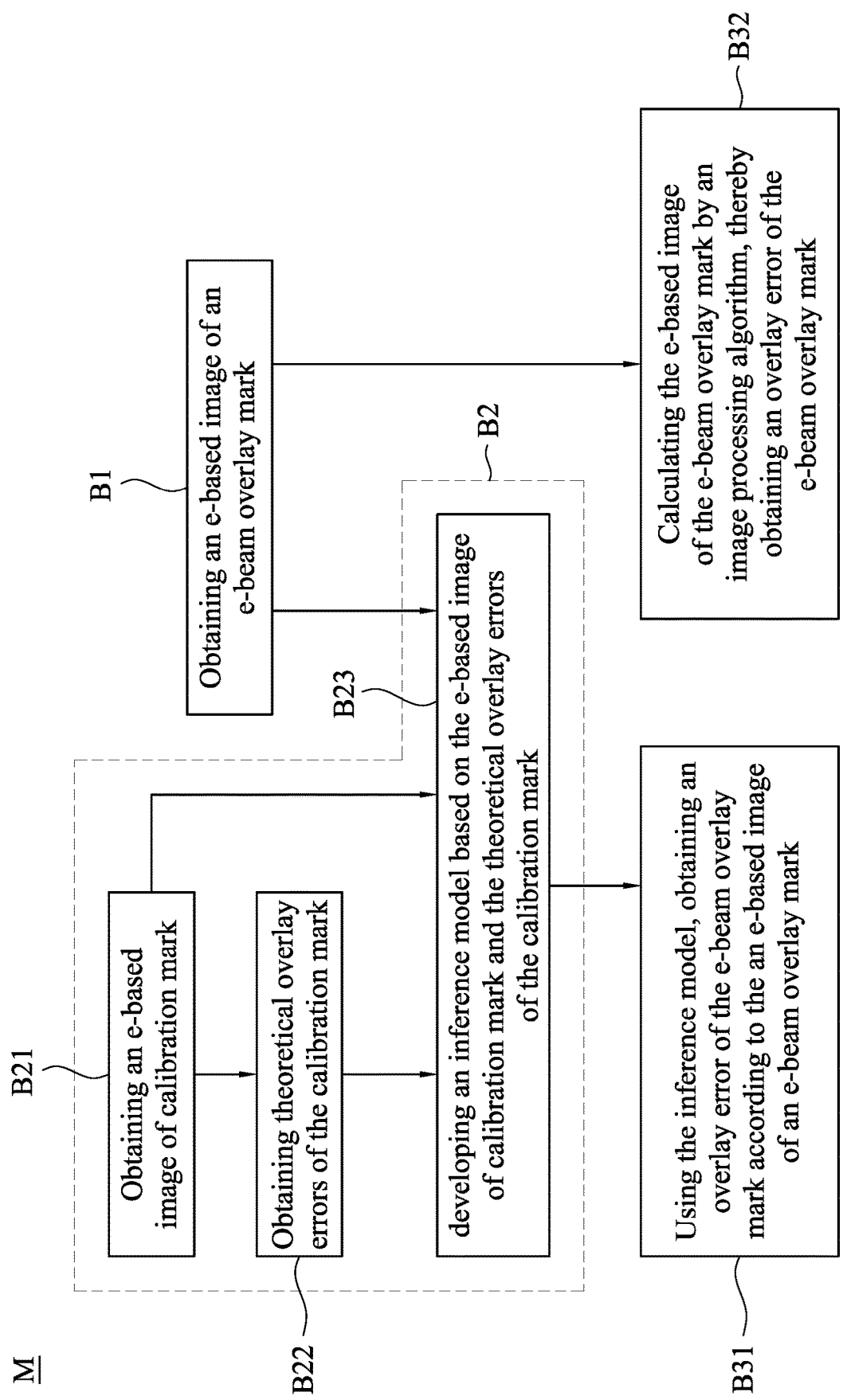
FIG. 4 is a block diagram shows a method for obtaining overlay errors from an electron-based image.

FIG. 4 is a flow chart showing an overlay error estimation method M for obtaining overlay errors from electron-based images. The method M includes operations B1, B2, B31, and B32. The operation B1 shows an e-based image of an e-beam overlay mark is obtained by a processor in a computer. The operations B31 and B32 show how an overlay error of the e-beam overlay mark is obtained. The operation B2 shows a methodology for training a model for the overlay error estimation, in which the operation B2 includes the operations B21-B23. A model for the overlay error estimation is trained by using artificial intelligence including machine learning, such as deep learning. For example, as shown in the operation B21, electron-based images associated with the sub-marks 601-649 of the reference mark 600 is obtained by the processor, and as shown in the operation B22, determined and known theoretical overlay errors associated with the sub-marks 601-649 of the reference mark 600 are received by the processor. An artificial neural network (ANN) may be used in the operation B23 and may be trained based on inputs (i.e., the e-based image of reference mark 600 obtained from operation B21) and the ground truths (i.e., the theoretical overlay errors of the reference mark obtained from operation B22), thereby generating an inference model, which is an predicted relationship between the input and the ground truths.

The artificial neural network (ANN) is an interconnected group of artificial neurons that uses a mathematical or computational model for information processing based on a connectionist approach to computation. There are plural layers to a feedforward artificial neural network: an input layer, at least one hidden layer, and an output layer. The input layer is a data vector that is fed into the network. The input layer feeds into the hidden layer, which feeds into the output layer. The actual processing in the network occurs in the nodes of the hidden layer and the output layer. When enough neurons are connected together in the layers, the network can be trained to perform certain functions using a training algorithm. The fully connected layers connect every neuron in one layer to every neuron in another layer.

Convolutional neural network is a kind of ANN, in which hidden layers of a CNN may include convolutional layers, pooling layers, fully connected layers and normalization layer. The convolutional layers apply a convolution operation to the input, passing the result to the next layer. The convolution emulates the response of an individual neuron to visual stimuli. The pooling layers combine the outputs of neuron clusters at one layer into a single neuron in the next layer, in which a maximum value or an average value from each of a cluster of neurons may be used.

Using input (i.e., the e-based image of the reference mark 600 obtained from operation B21) and the ground truths (i.e., the theoretical overlay errors of the reference mark obtained from operation B22), the ANN may implement an iterative training process. Training may be based on a wide variety of learning rules or training algorithms. For example, the learning rules may include one or more of the following: back-propagation, real-time recurrent learning, pattern-by-pattern learning, supervised learning, interpolation, weighted sum, reinforced learning, temporal difference learning, unsupervised learning, and/or recording learning. As a result of the training, the ANN may learn to modify its behavior in response to its environment, and obtain an inference model for overlay measurement as shown in operation B213. The inference model shown in operation B213 may represents a model upon which a machine may determine an appropriate response (e.g., overlay errors) to new data (e.g., new electron-based images). The inference model in operation B213 may represent, for example, relationship information between electron-based images and the overlay errors. The inference model may be stored in any form at any convenient location, such as a memory in the computer, and may be used for forecast. In some embodiments, other learning methods may also be used to produce the inference model.

When the wafer is detected by the electron beam, the computer may receive detection results (e.g., the electron-based image) having information of the whole wafer. To be specific, the detection results (e.g., plural electron-based images) may include information of the electron-based reference mark 600 and information of the electron-based overlay marks 400. The processor of the computer may generate the inference model (i.e., as shown in the operation B2) from the information of the electron-based reference mark 600, for example, from some electron-based images associated with the electron-based reference mark 600. Then, from the information of the electron-based overlay marks 400, for example, from one or more electron-based images associated with the electron-based overlay marks 400, through the inference model shown in operation B23, the machine may generate respective overlay errors of the electron electron-based overlay marks 400 as shown in the operation B31.

In some other embodiments, an algorithm for analyzing the electron-based image is used as shown in the operation B32, and the operations B2 and B32 may be omitted. When the electron-based image is received by the computer as shown in the operation B1, through the algorithm in the operation B32, some electron-based image associated with the electron-based overlay marks 400 is analyzed, and the overlay error between patterns of two layer is obtained as shown in the operation B32. In the present embodiments, from the electron-based image, the overlay error in the X direction between patterns of two layer can be correspondingly determined by offsets HV1'-HV4' of the electron beam B1 in the X direction. For example, the overlay error in the X direction (shift in the X direction or X_shift) between the features 134a and 154 can be determined by HV31' and HV32' in a formula as X_shift=(HV31'-HV32')/2. Similarly, the overlay error between the features 134 and 154 in the Y direction can be determined by the offset of the electron beam B1 in Y direction correspondingly.

The configuration of the device 200 of FIG. 1 may be similar to that of the electron-based overlay mark 400 of FIGS. 2A-2C. For example, the device 200 includes various transistors and conductive features of SRAM cells, and the transistors T under the mark 400 and the features 134, 154, and 164 of the mark 400 may have the same configuration with the transistors and the conductive features of the device 200, such that the electron-based overlay mark 400 may be described as SRAM cell-like. For example, the device 200 may include conductive features similar to the features 134, 154, and 164 of the electron-based overlay marks 400 in the ILD layers 120 and 140. The SRAM cell-like configuration of the mark 400 results in similar process behavior (e.g., etching behavior and polishing behavior) with the configuration of the device 200, such that while the processes (e.g., etching process and polishing process) are optimized for better forming the SRAM configuration of the device 200, the SRAM cell-like configuration of the mark 400 can be prevented from being damaged during etching or polishing process. The transistors of the device 200 are true and functional, while the transistors T under the mark 400 may be dummy. For example, the transistors T for the electron-based overlay mark 400 may be covered by a dielectric layer and electrically disconnected from a pad, which may connected to an external circuit for WAT. On the other hand, the transistor in the device region is connected to a conductive feature embedded the dielectric layer, and may be electrically connected to the pad connected to the external circuit for WAT. The top and cross-sectional views of the device 200 may be substantially the same as those shown in FIGS. 2A-2C, and not repeated herein.

Figure 5A:
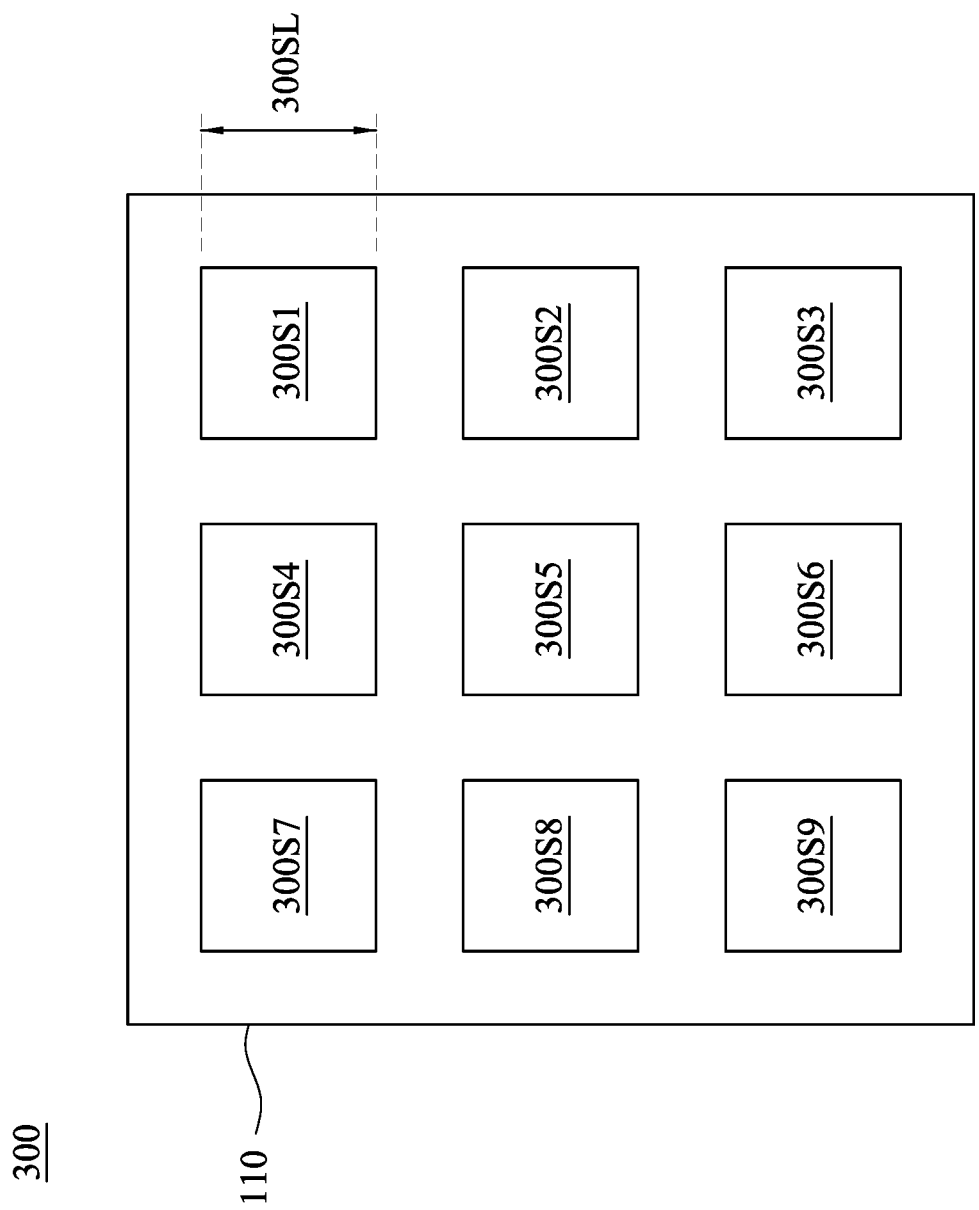
FIG. 5A is a top view of an optical overlay mark according to some embodiments of the present disclosure.
Figure 5B:
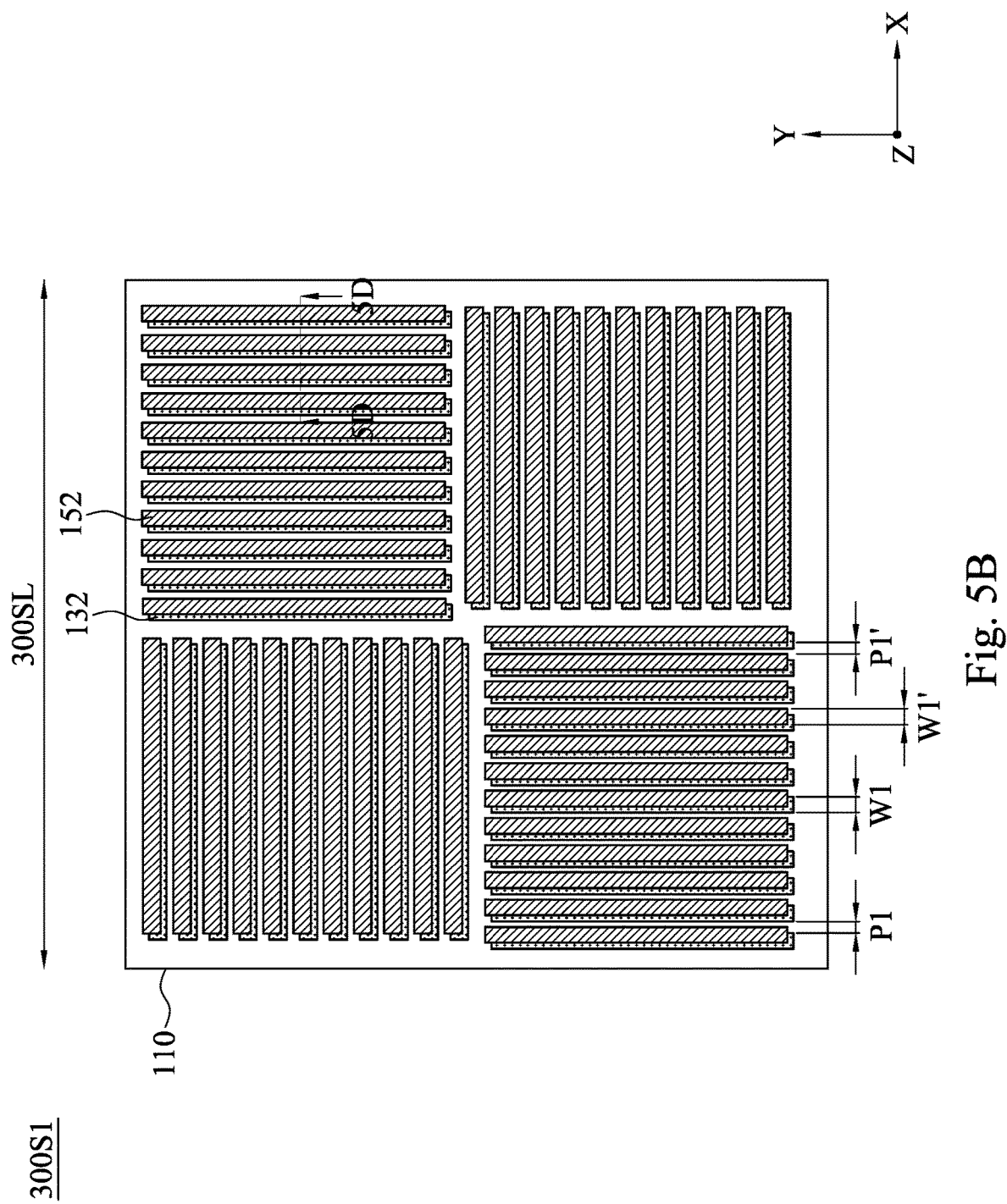
FIG. 5B is an enlarged top view of a sub-optical mark of FIG. 5A.
Figure 5C:
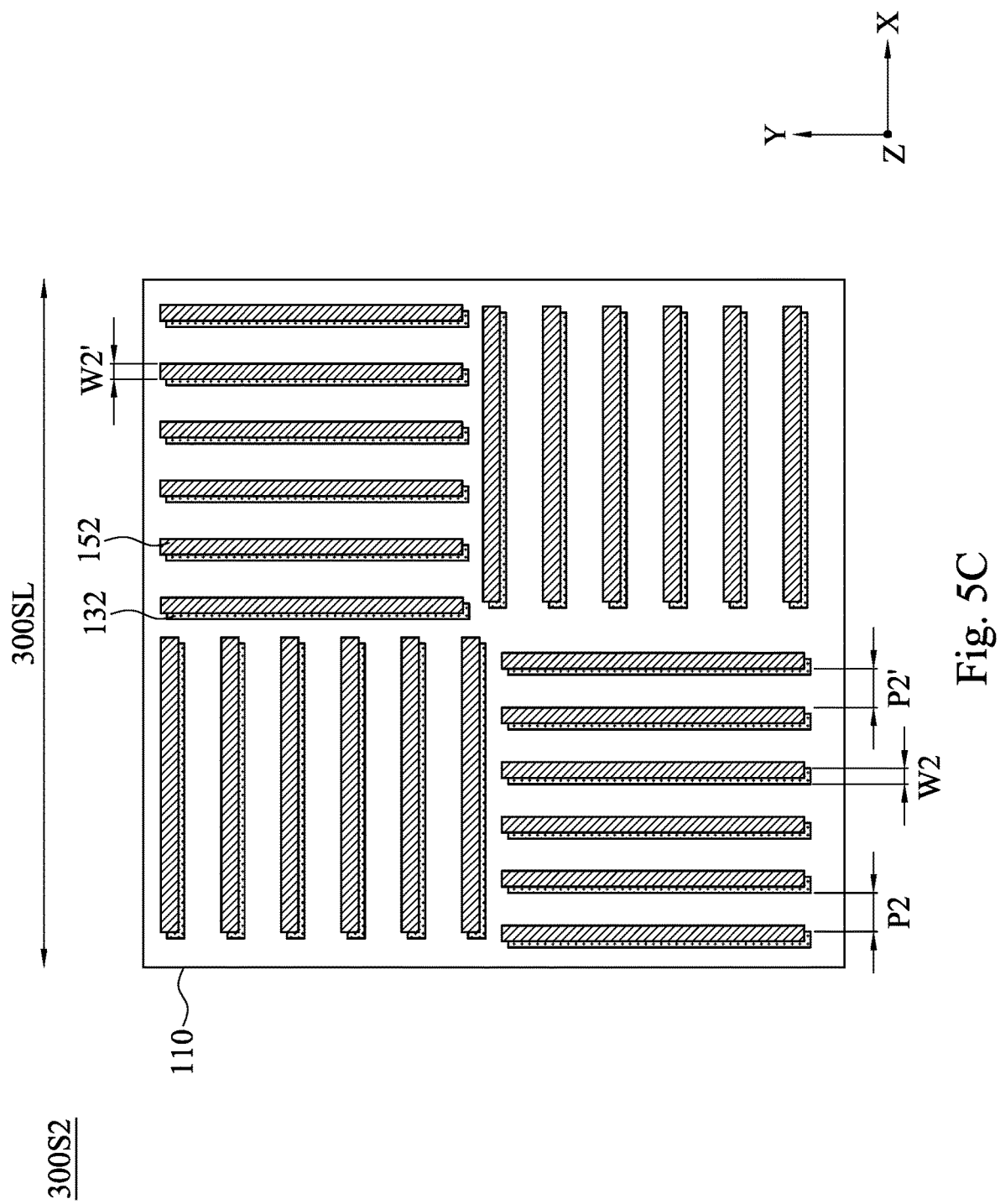
FIG. 5C is an enlarged top view of another sub-optical mark of FIG. 5A.

FIG. 5A is a top view of an optical overlay mark 300 of FIG. 1 according to some embodiments of the present disclosure. The optical overlay mark 300 includes plural sub-optical marks 300S1-300S9. For example, FIGS. 5B and 5C are top views of sub-optical marks 300S1 and 300S2 of FIG. 5A according to some embodiments of the present disclosure. Each of the sub-optical mark 300S1 and 300S2 includes first overlay features 132 and second overlay features 152 over the pre-layer structure 110. In some embodiments, the configuration of the sub-optical marks 300S1-300S9 are different. In FIG. 5B, the features 132 of the mark 300S1 has pitch P1 therebetween, the features 152 of the mark 300S1 has pitch P1' therebetween, the features 132 of the mark 300S1 has a width W1, and the features 152 of the mark 300S1 has a width W1'. In FIG. 5C, the features 132 of the mark 300S2 has pitch P2 therebetween, the features 152 of the mark 300S2 has pitch P2' therebetween, the features 132 of the mark 300S2 has a width W2, and the features 152 of the mark 300S2 has a width W2'. For example, the pitch P1 of the mark 300S1 is less than the pitch P2 of the mark 300S2, and the pitch P1' of the mark 300S1 is less than the pitch P2' of the mark 300S2. In some embodiments, the width W1 of the mark 300S1 is different from the width W2 of the mark 300S2, and the width W1' of the mark 300S1 is different from the width W2' of the mark 300S2.

Figure 5D:
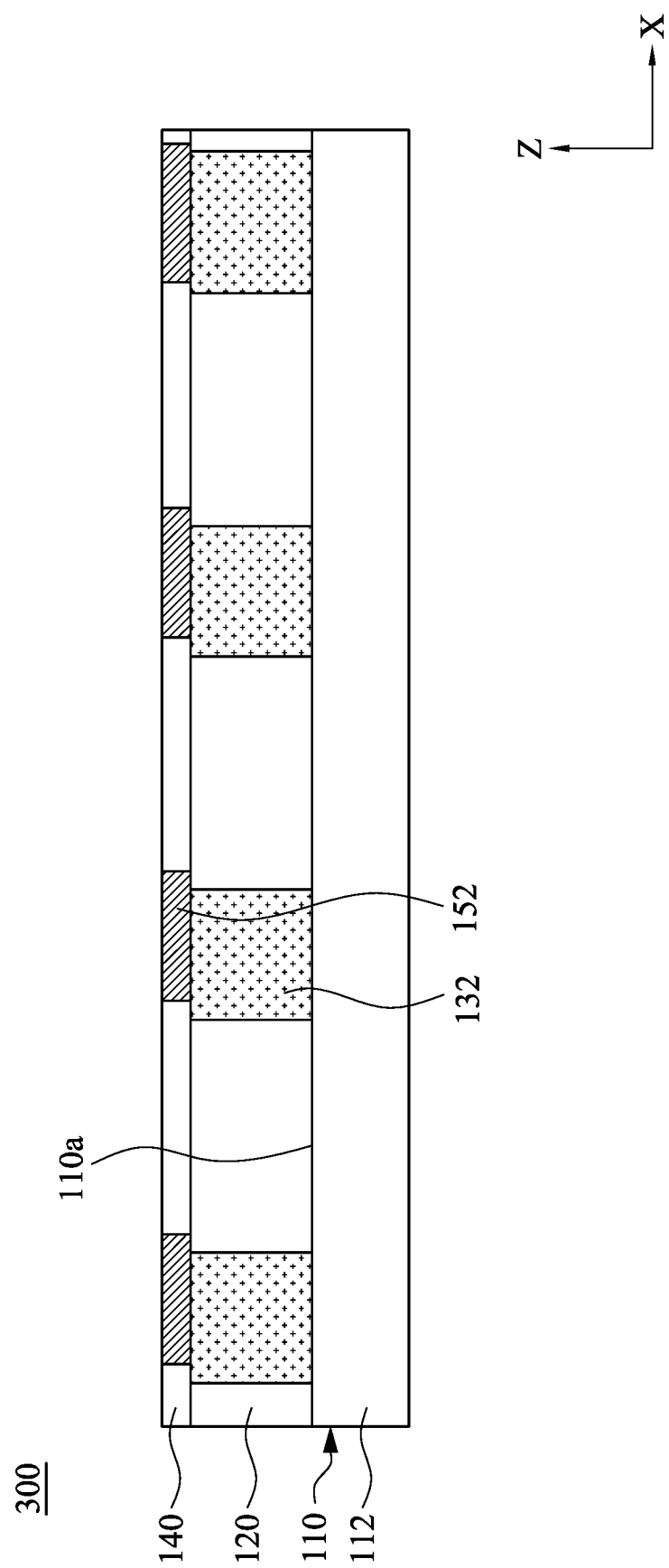
FIG. 5D is a cross sectional view taken along line 5D-5D of FIG. 5B.

For the purposes of horizontal and vertical overlay measurements, some of the first overlay features 132/152 may extend along the direction X, while the other of the first overlay features 132/152 may extend along the direction Y. Referring to both FIG. 5B and FIG. 5D, FIG. 5D is a cross sectional view taken along line 5D-5D of FIG. 5B. The first overlay features 132 are in the ILD layer 120 over the pre-layer structure 110, and the second overlay features 152 are in the ILD layer 140. The overlay features 132 and 152 may also be referred to the pattern of the first and second layers in an optical mark region, respectively.

Referring back to FIG. 1, in some embodiments, since an electron-based system provides a higher imaging resolution than that of an optical microscope, a critical dimension of the electron-based overlay marks 400 can be smaller than that of the optical overlay marks 300. For example, a critical dimension of the optical overlay marks 300 (e.g., the pitches P1 and P1' shown in FIGS. 5B and 5C) may be in a range from about 200 nanometers to about 500 nanometers, and a critical dimension of the electron-based overlay marks 400 (e.g., the distance between neighboring features 134 shown in FIG. 2A) can be in a range from about 1 nanometer to about 100 nanometers. As such, when sizes of the marks 300 and 400 are expected to be as small as possible for saving areas in intra-field, the size of the electron-based overlay marks 400 can be smaller than the size of the optical overlay marks 300. For example, the optical overlay marks 300 has a length 300L (see FIG. 1) in a range from about 10 micrometers to about 200 micrometers. To be specific, the sub-optical mark 300S1-300S9 (referring to FIG. 5A) may have a length 300SL in a range from about 10 micrometers to about 20 micrometers. If the size of the sub-optical mark 300S1-300S9 is less than about 10 micrometers, the sub-optical mark 300S1-300S9 may not be detectable or identifiable by the optical microscope. If the size of the sub-optical mark 300S1-300S9 is greater than about 20 micrometers, the optical overlay marks 300 may occupy too much space. The size of the electron-based overlay marks 400 can be smaller than a size of the sub-optical mark 300S1-300S9. The electron-based overlay marks 400 has a length 400L (see FIG. 1) in a range from about 1 micrometer to about 10 micrometers, for example, in a range from about 1 micrometer to about 5 micrometers, which is detectable by the electron-based system and does not occupy much space in the chip region CR. A size of electron-based reference mark 600 may be greater than that of the electron-based overlay marks 400 since the mark 600 includes more information and features than the electron-based overlay marks 400.

Reference is made to FIG. 1. In some other embodiments, the marks 300, 400 and 600 may be formed in chip frame regions NSR (e.g. frame regions of the chip regions CR near scribe line regions SR) of the chip regions CR, in which the device 200 is not in the chip frame regions NSR. Each of the regions NSR has an edge adjoining the scribe line regions SR and an opposite edge that is a certain distance (e.g., about 1 to about 2 millimeters) away from the scribe line regions SR. In some other embodiments, some of the marks 300 and 400 may be formed adjacent to the device 200 and out of the chip frame regions NSR. In some embodiments, some of the marks 400 may be formed in the region where the device 200 is formed. In some embodiments, some of the marks 300 and 400 may be formed in the scribe line regions SR.

Figure 6:
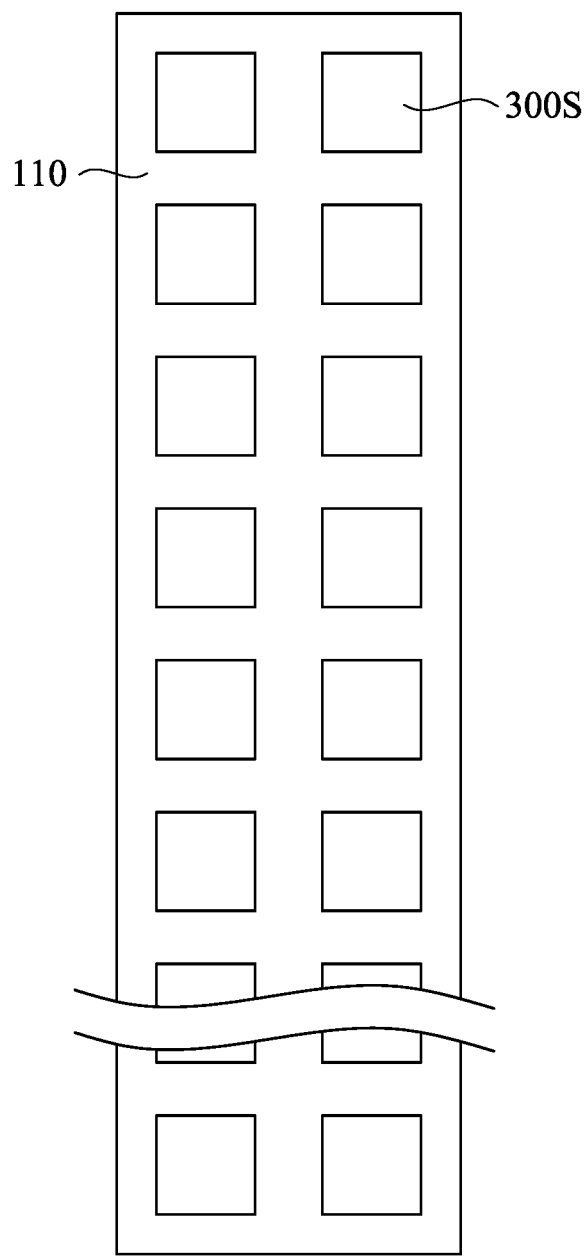
FIG. 6 is a top view of a test line according to some embodiments of the present disclosure.

FIG. 6 is a top view of a test line 300' of FIG. 1 according to some embodiments of the present disclosure. The test line 300' is located in the scribe line region SR (referring to FIG. 1) and includes plural sub-optical marks 300S. The configuration of the sub-optical marks 300S may be similar to the sub-optical marks 300S1-300S9 illustrated in FIGS. 5B and 5C. In some embodiments, the configurations of the plural optical marks 300S are different. For example, the pitch between the features of one of the marks 300S is different from that of another of the marks 300S. In some embodiments, the width of the features of one of the marks 300S is different from that of another of the mark 300S. The configuration of the sub-optical marks 300S is similar to those aforementioned, and not repeated herein.

FIG. 7 is a schematic view of an electron-based system 900 according to some embodiments of the present disclosure. The electron-based system 900 is an electron-based metrology technique that utilizes an electron-based imaging for various monitoring, measurement and/or analysis. In some embodiments, the electron-based system 900 includes an electron microscope, such as scanning electron microscope (SEM). The electron-based system 900 provides a higher imaging resolution than that of an optical microscope because an electron beam can be energized to have a shorter wavelength. The electron-based system 900 includes a particle source 910, one or more lenses 920, a scanner 930, a wafer stage 940, and a detector 950.

The particle source 910 provides a particle beam. In some embodiments, the particle source 910 is an electron source and the particle beam is an electron beam B1. In some embodiments, the source 910 is an electron gun with a mechanism to generate electrons, such as by thermal electron emission. In some other embodiments, the electron gun includes a tungsten (or other suitable material) filament designed and biased to thermally emit electrons. In FIG. 7, an electron beam B1 is illustrated as an incident electron beam from the source and directed toward the sample to be detected.

The lenses 920 impact the electron incident beam B1 from the source 910 for imaging effect. In some embodiment, the lenses 920 includes a condenser lens to focus the electron beam B1 into smaller diameter, and further includes an objective lens properly configured. Various lenses, such as magnets, are designed to provide force to the electrons for proper imaging effect, such as focusing.

The scanner 930 deflects the electron beam B1 for scanning a certain region of the sample in a certain mode, such as raster mode. In some embodiments, the sample to be detected is a wafer 100 for integrated circuits. The scanner 930 is operable to direct the electron beam B1 to the wafer 100 positioned on a wafer stage 940. In one example, the scanner 930 may include one or more coils to deflect the electron beam B1 in two orthogonal directions such that the electron beam B1 is scanned over a surface area of the wafer 100, particular along direction X and direction Y (referring to FIG. 2A). In some embodiments, the wafer stage 940 is operable to move such that the electron beam B1 is directed to various electron-based overlay marks 400 and the reference mark 600 formed on the wafer 100.

The detector 950 receives a signal (e.g., an overlay signal) from the wafer 100. The overlay signal is an energy flow from the substrate and generated by the interaction between the incident electron beam B1 and the wafer 100. The overlay signal is from a certain area of the wafer 100, such as the spot of the incident electron beam B1. In some examples, the detector 950 is designed operable to move and receive the intended overlay signal from the wafer 100.

In some embodiments, the overlay signal includes reflected electrons that are the reflection of the incident electron beam B1 from the substrate after interaction (such as elastic collision) with the atoms of the wafer 100. In some other embodiments, the overlay signal includes electrons that are secondary electrons generated from the substrate by the inelastic collision between the incident electron beam B1 and the atoms of the wafer 100. In still some other embodiments, the overlay signal includes an electromagnetic radiation emitted from the substrate after the inelastic collision between the incident electron beam B1 and the atoms of the wafer 100. In some other embodiments, the overlay signal includes an electrical current in the wafer 100. That electrical current is from the incident electron beam absorbed to the wafer 100 and therefore referred to as beam current.

The detector 950 is designed with a proper mechanism to effectively detect the overlay signal (backscattered electron, secondary electron, electromagnetic radiation, electrical current or combination of above mentioned). The detector 950 is further positioned and configured for proper detection. For example, if the overlay signal is the beam current, the detector 950 may be coupled to the wafer 100 for current detection.

The electron-based system 900 may further include other components and modules. In some examples, the electron-based system 900 includes an amplifier designed and configured to amplify the overlay signal to a higher level. In some other examples, the electron-based system 900 includes a display module to display the scanned image to be visualizable to human eyes. In some examples, the electron-based system 900 further includes a module for extraction and analysis based on the detected data and scanned images.

Figure 8A:
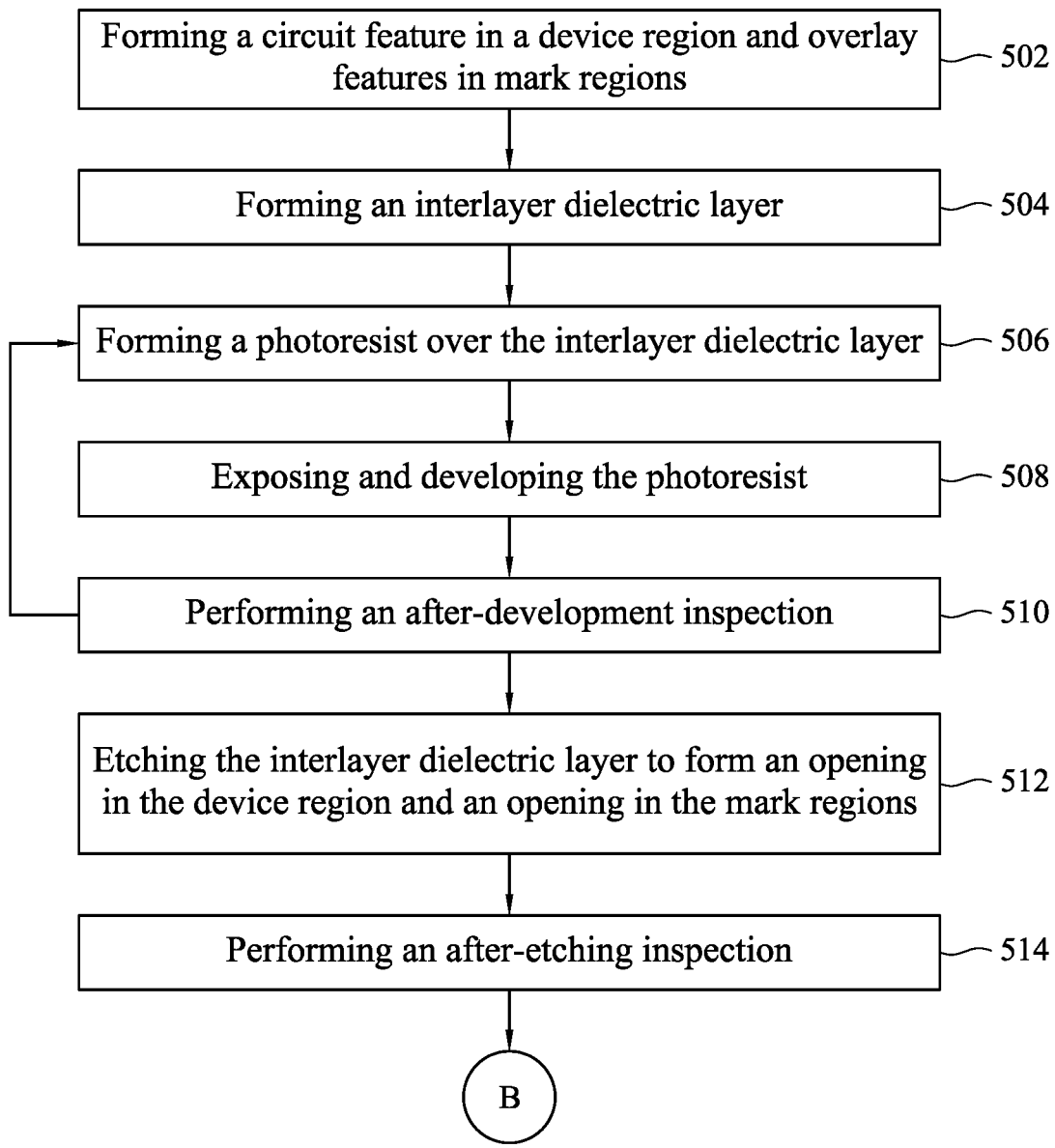
FIGS. 8A and 8B are flow charts of a method for forming a semiconductor device according to some embodiments of the present disclosure.
Figure 8B:
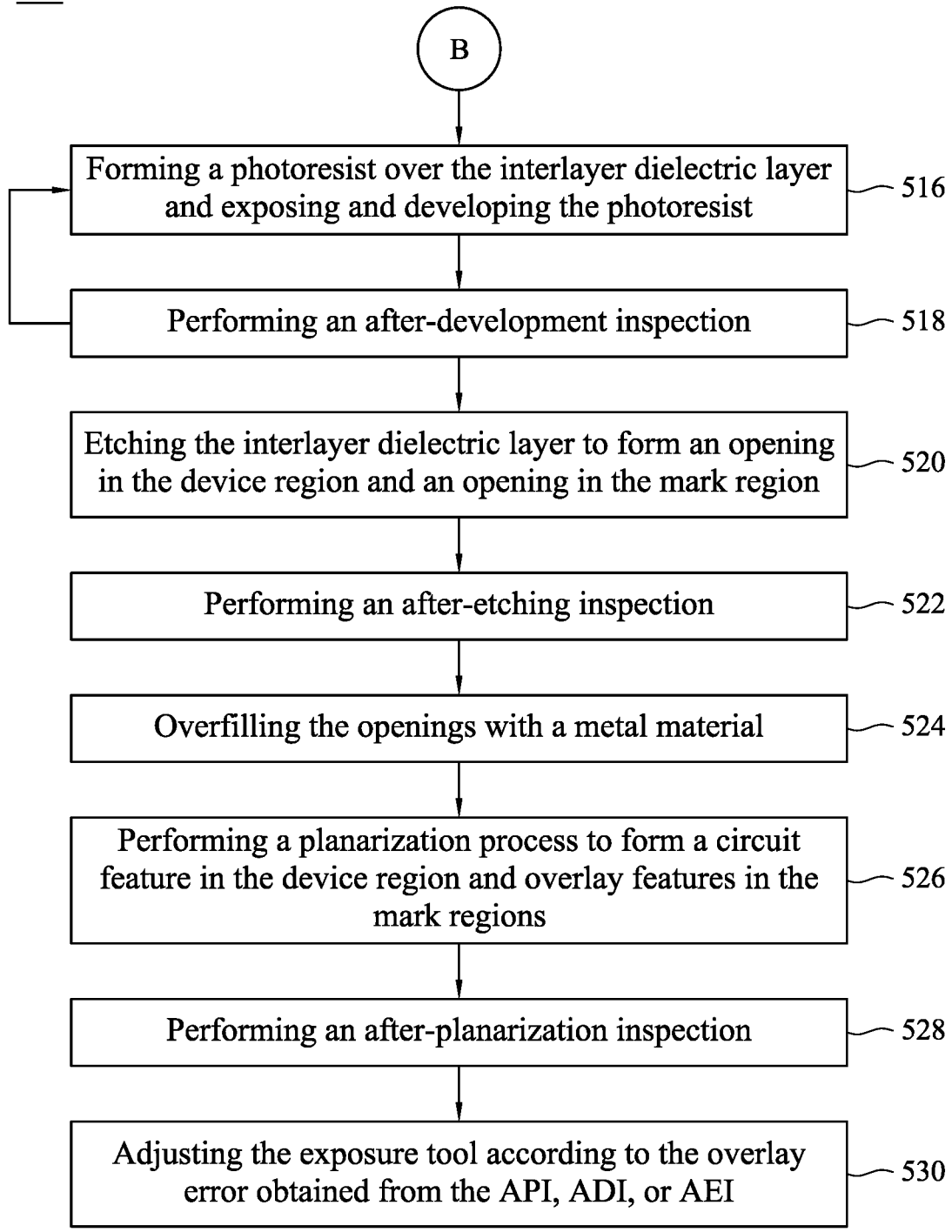

FIGS. 8A and 8B are flow charts of a method 500 for forming a semiconductor device according to some embodiments of the present disclosure. FIGS. 9A-9I illustrate plural intermediate stages of the method 500 for forming a semiconductor device according to some embodiments of the present disclosure. The illustration is merely exemplary and is not intended to limit beyond what is specifically recited in the claims that follow. It is understood that additional operations may be provided before, during, and after the operations shown by FIGS. 8A and 8B, and some of the operations described below can be replaced or eliminated for additional embodiments of the method. The order of the operations/processes may be interchangeable.

Figure 9A:
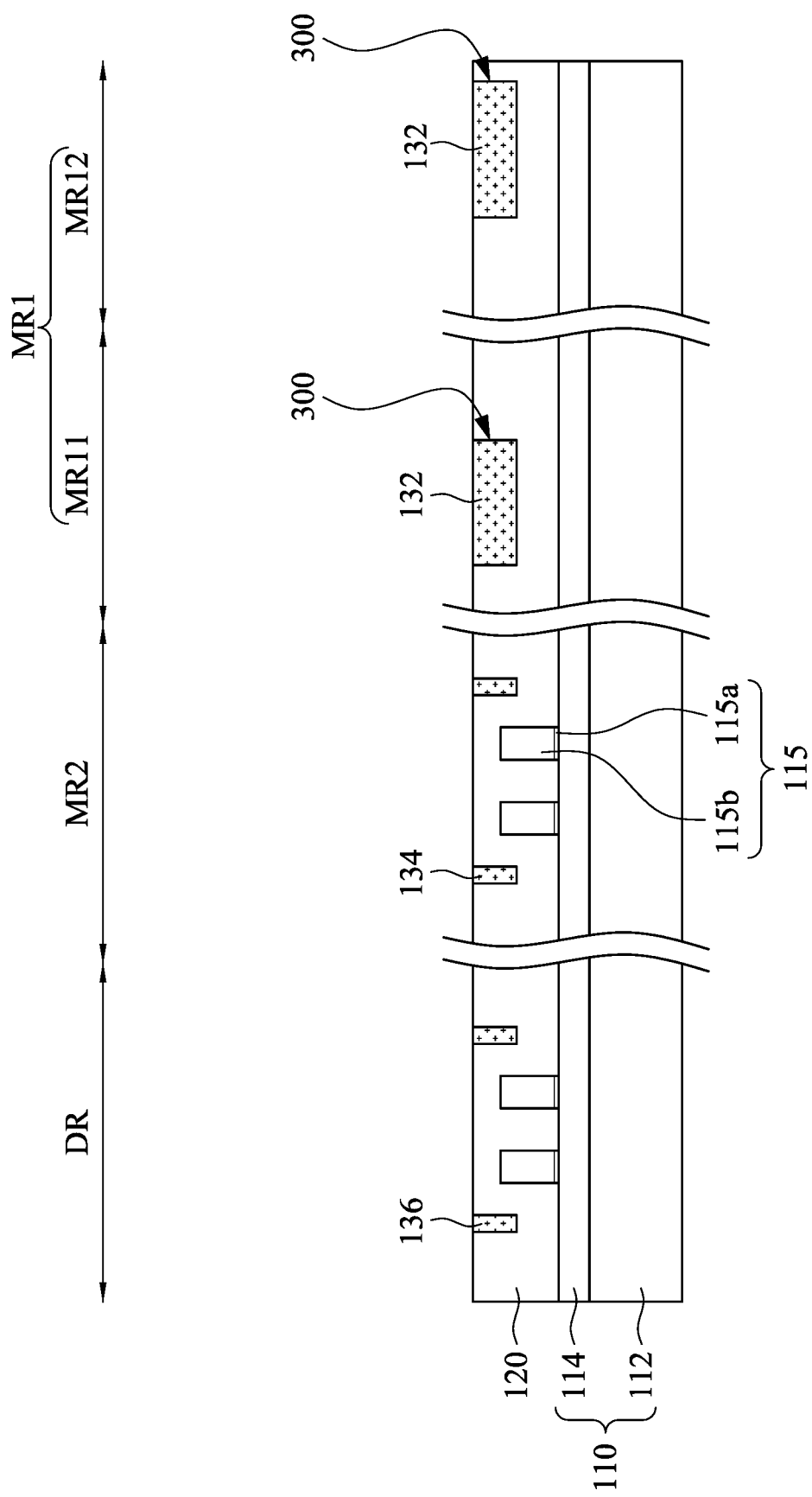
FIGS. 9A-9I illustrate plural intermediate stages of a method for forming a semiconductor device according to some embodiments of the present disclosure.

Referring to FIG. 8A, the method 500 begins at operation 502 where circuit features and overlay features are formed in device and mark regions respectively. For example, referring to FIG. 9A, FIG. 9A is a cross-sectional view of a portion of the chip region CR of the wafer 100 (referring to FIG. 1) according to some embodiments of the present disclosure. A pre-layer structure 110 is provided. The pre-layer structure 110 has a device region DR where the device 200 (referring to FIG. 1) is to be formed, an optical mark region MR1 where the optical overlay marks 300 (referring to FIG. 1) are to be formed, and an electron beam mark region MR2 where the electron-based overlay mark 400 (referring to FIG. 1) is to be formed. In the present embodiments, the optical overlay marks 300 (referring to FIG. 1) in regions MR11 and MR12 of the optical mark region MR1 are for overlay measurement of two different resist layers, respectively. In some embodiments, at least one of the regions MR11 and MR12 may be omitted.

The pre-layer structure 110 includes a semiconductor substrate and overlying layers such as contact etch stop layers, inter-layer dielectric, inter-metal dielectrics, vias, and metal lines formed therein. For example, the pre-layer structure 110 includes a semiconductor substrate 112, isolation dielectrics 114, gate structures 115, epitaxial source/drain features (referring to FIG. 2C), which may form transistors of SRAM cells. The semiconductor substrate may additionally or alternatively include germanium, silicon germanium, gallium arsenic, or other proper semiconductor materials. Various doped regions, dielectric features, and/or a portion of multilevel interconnects are formed over the semiconductor substrate. In some embodiments, the semiconductor substrate 112 may further include various doped features for various microelectronic components, such as a complementary metal-oxide-semiconductor field-effect transistor (CMOSFET), an imaging sensor, a memory cell, and/or a capacitive element. In some embodiments, the semiconductor substrate includes conductive material features and dielectric material features configured for coupling and isolating various microelectronic components, respectively. In some embodiments, the pre-layer structure 110 includes one or more material layers formed on the semiconductor substrate.

In some embodiments, an interlayer dielectric (ILD) layer 120 is formed over the pre-layer structure 110. The ILD layer 120 may include a dielectric material, such as tetraethoxysilane (TEOS), an extreme low-k (ELK) dielectric material, nitrogen-free anti-reflective coating (NFARC), silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, parylene, BCB (bis-benzocyclobutenes), polyimide, or any combination thereof. The ELK dielectric material has a dielectric constant less than, for example, about 2.5. In some embodiments, the ILD layer 120 may be deposited by chemical vapor deposition (CVD), high density plasma (HDP) CVD, sub-atmospheric CVD (SACVD), spin-on coating, sputtering, or other suitable techniques.

In some embodiments, first overlay features 132 are formed in the ILD layer 120 in the optical mark regions MR11 and MR12, first overlay features 134 are formed in the ILD layer 120 in the electron beam mark region MR2, first circuit features 136 are formed in the ILD layer 120 in the device region DR. The formation of the features 132-136 may include etching openings in the ILD layer 120, overfilling the openings with a material layer, and removing excess portions of the material layer out of the openings, for example, by a planarization process. The material layer may be made of conductive materials, such as metal. The first circuit feature 136 can serve as a conductive line or conductive via of an interconnect structure, or a source/drain contact of a semiconductor device, such as a fin field effect transistor (FinFET). In some embodiments, the features 132-136 may include a conductive material such as copper, although other materials, such as tungsten, aluminum, gold, or the like, can alternatively be utilized. In some embodiments in which the features 132-136 are formed of copper, the features 132-136 may be deposited by electroplating techniques, although any method of formation can alternatively be used.

Figure 9B:
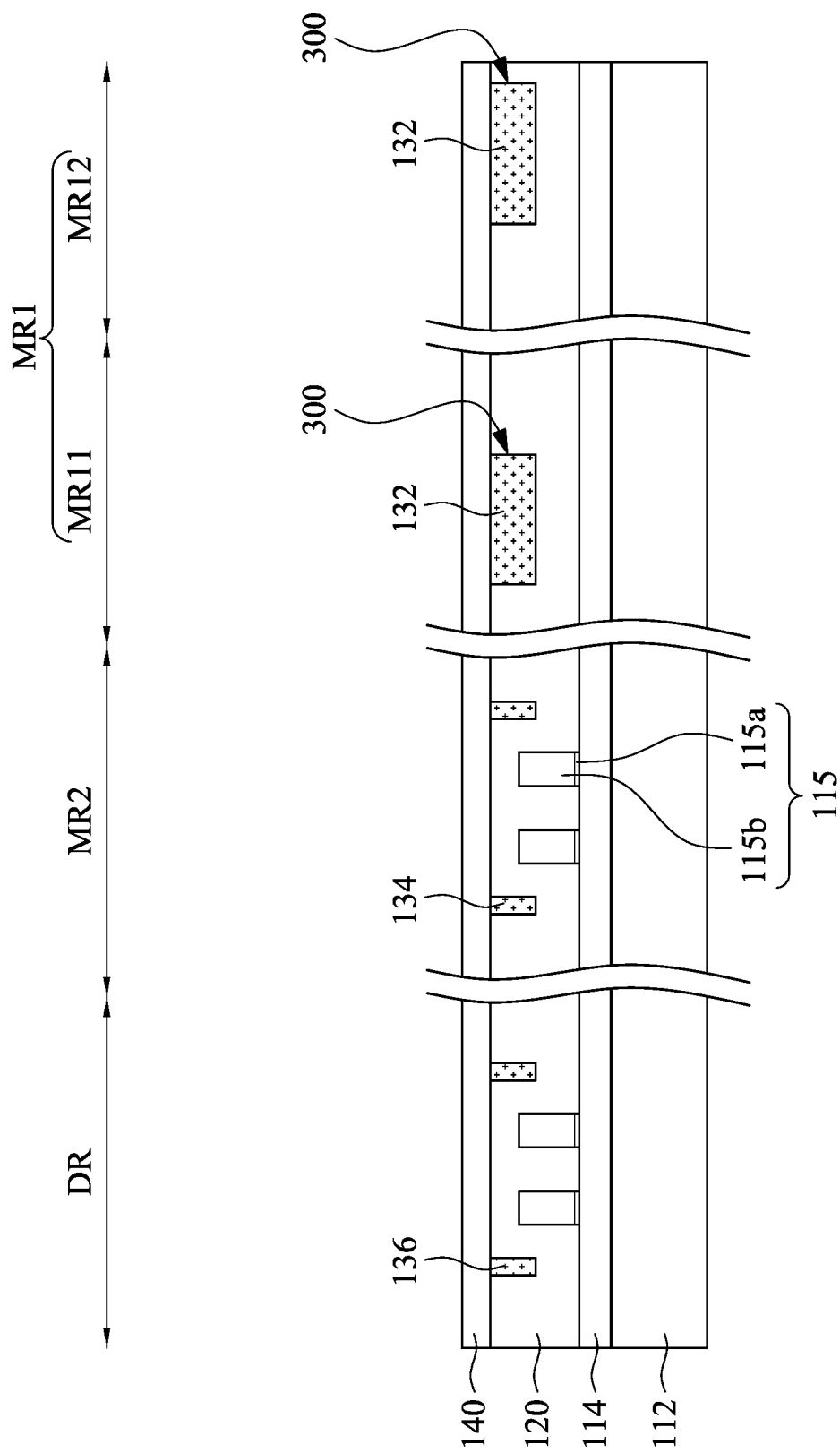

Referring to FIG. 8A, the method 500 proceeds to operation 504 where an interlayer dielectric (ILD) layer is formed over the circuit features and overlay features. Referring to FIG. 9B, the ILD layer 140 is formed over the ILD layer 120 and the features 132-136. In some embodiments, the ILD layer 140 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 140 may be formed using, for example, CVD, ALD, spin-on-glass (SOG) or other suitable techniques.

In some embodiments, a contact etch stop layer (CESL) may be optionally blanket formed on the structure shown in FIG. 9A, and then the ILD layer 140 is formed over the CESL layer. That is, there is a CESL between the ILD layer 120 and the ILD layer 140. The CESL may include a material different from the ILD layers 120 and 140. The CESL includes silicon nitride, silicon oxynitride or other suitable materials. The CESL can be formed using, for example, plasma enhanced CVD, low pressure CVD, ALD or other suitable techniques.

Figure 9C:
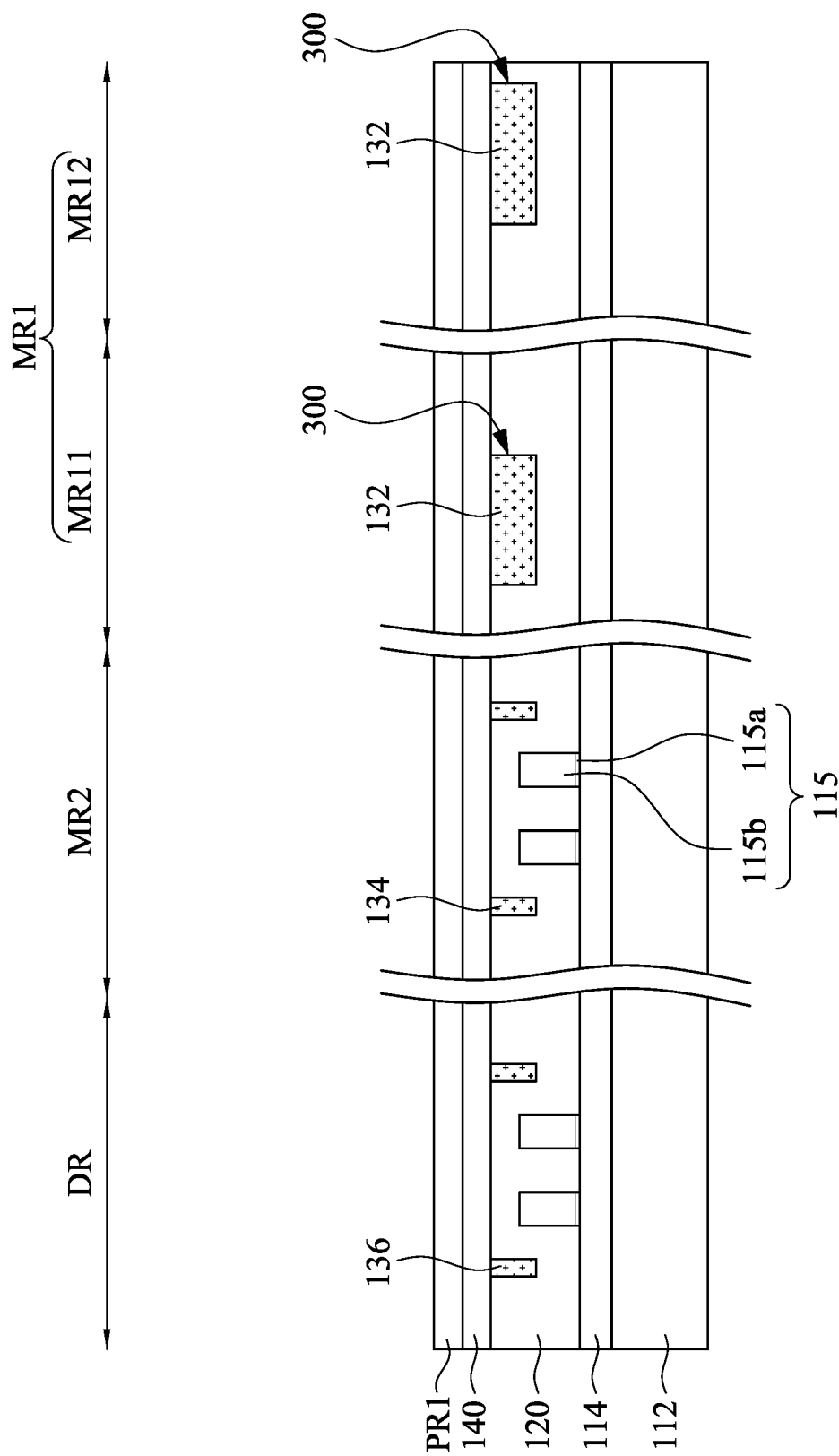

Referring to FIG. 8A, the method 500 proceeds to operation 506 where a photoresist layer is formed over the ILD layer. Referring to FIG. 9C, a photoresist layer PR1 is formed over the ILD layer 140. The photoresist layer PR1 may be made of suitable photo-sensitive organic materials. In some embodiments, a pad layer and a mask layer are formed on the ILD layer 140 before the formation of the photoresist layer PR1, and the photoresist layer PR1 is formed on the mask layer. The pad layer may be a thin film comprising silicon oxide formed using, for example, a thermal oxidation process. The pad layer may act as an adhesion layer between the ILD layer 140 and mask layer. The pad layer may also act as an etch stop layer for etching the mask layer. In some embodiments, the mask layer is formed of silicon nitride, for example, using low-pressure chemical vapor deposition (LPCVD) or plasma enhanced chemical vapor deposition (PECVD). The mask layer is used as a hard mask during subsequent photolithography processes.

Figure 9D:
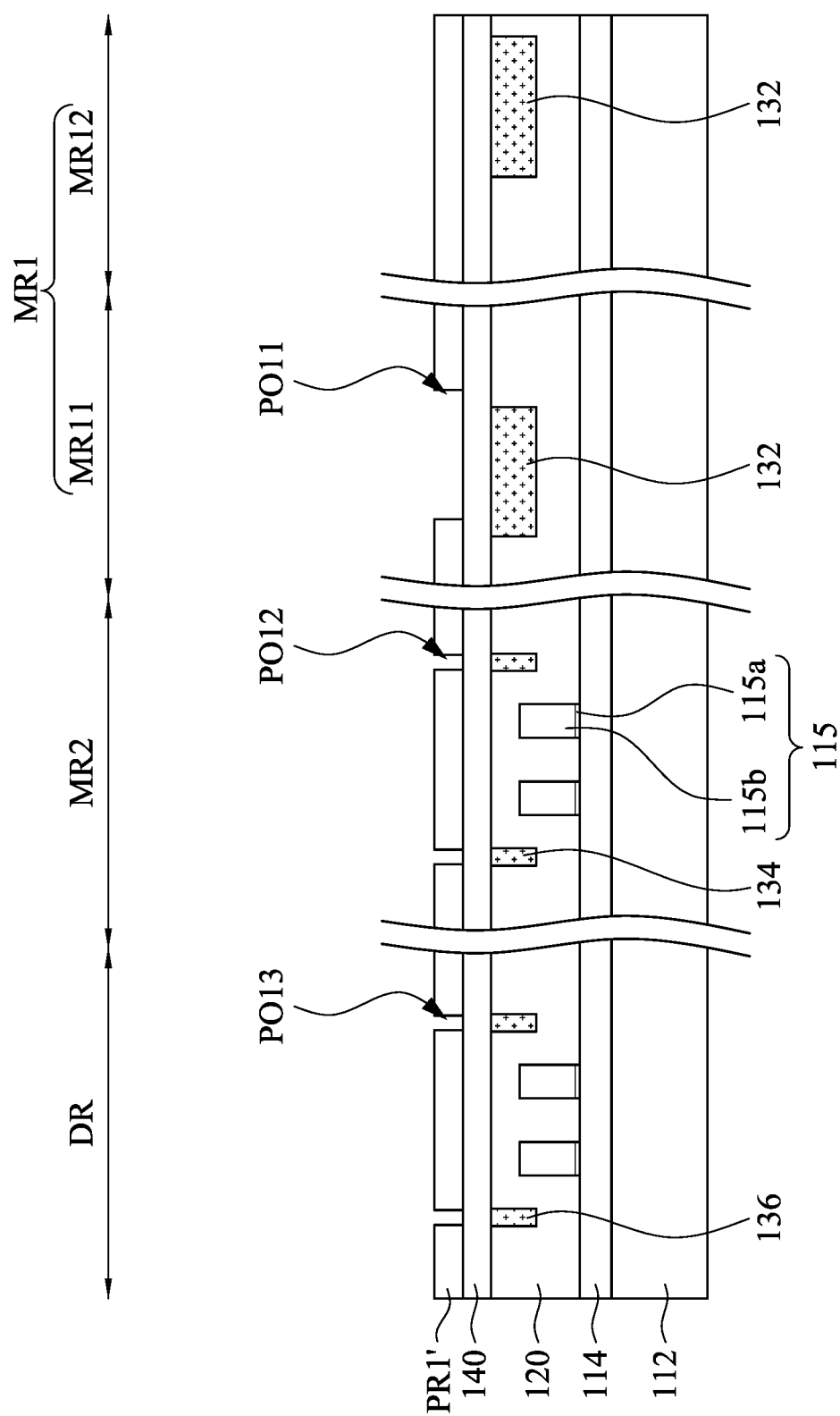

Referring to FIG. 8A, the method 500 proceeds to operation 508 where the photoresist layer is exposed and developed. Referring to FIG. 9D, portions of the photoresist layer PR1 is exposed and developed. Herein, an exposure tool (e.g., the exposure tool 820 in FIG. 12) may provide suitable light patterns to expose the photoresist layer PR1. The pattern in the exposed photoresist layer PR1 is then chemically developed. After the exposure and development, portions of the photoresist layer PR1 are removed, and other portions of the photoresist layer PR1 remains and are referred to as photoresist PR1' hereinafter. The photoresist PR1' includes openings PO11, PO12, PO13 in the optical mark region MR11, the electron beam mark region MR2, and the device region DR, respectively.

Referring to FIG. 8A and FIG. 9D, the method 500 proceeds to operation 510 where an after-development inspection (ADI) is performed for obtaining positions of the photoresist. In some embodiments, ADI may be performed with optical systems, such as an optical microscope, to inspect the position of the openings PO11 of the photoresist PR1' and the first overlay feature 132 in the region MR11. For example, an optical based image including information of the photoresist PR1' and feature 132 is captured during the ADI. The optical microscope may not inspect the position of the openings PO12 and PO13 due to optical limitation.

An overlay analysis (i.e., high order overlay analysis) is performed to obtained overlay error from the optical based image in some embodiments. If the overlay error is within an acceptable range, the photoresist PR1' may be hard baked, and the method 500 proceeds to operation 512. If the overlay error is out of specification (e.g., greater than an acceptable range), the wafer may be sent to rework. To be specific, a rework process may be initiated, such as removing the overlying photoresist PR1' from the ILD layer 140 and forming another photoresist over the ILD layer 140 with consequence that re-optimizes the exposure tool control algorithm for exposing photoresist. For example, the photoresist PR1' may be removed, the method 500 goes back to operation 506 by forming the photoresist, and the exposure tool (e.g., the exposure tool 820 in FIG. 12) used at operation 508 is re-optimized based on the previous analyzed overlay error.

In some embodiments, a controller (e.g., a controller 810 in FIG. 13) may process the inspection result, perform the overlay analysis to determine the overlay error, and perform operations according to the result of the overlay analysis. For example, the controller may improve/optimize the exposure tool (e.g., the exposure tool 820 in FIGS. 12 and 13) and initiate a rework process. In some embodiments, the controller may send the wafer to the next operation in fabrication process.

In some other embodiments, the ADI may be performed with an electron-based system (e.g., the system 900 in FIG. 7) to inspect the position of the openings PO11 of the photoresist PR1' and the first overlay feature 132 in the region MR11 and/or the positions of the openings PO12 of the photoresist PR1' and the first overlay feature 134 in the region MR2, and the positions of the openings PO13 of the photoresist PR1' and the feature 136 in the region DR. An overlay analysis as illustrated as the overlay error estimation method in FIG. 4 is performed based on the inspection result of ADI, the overlay analysis may include determination of the overlay error between the photoresist PR1' and the overlay features 132-136. In some embodiments where the ADI is performed with an electron-based system, the controller may perform the method M in FIG. 4 for the determination of overlay errors between the photoresist PR1' and the first overlay feature 132. In some other embodiments, the ADI may be omitted.

Figure 9E:
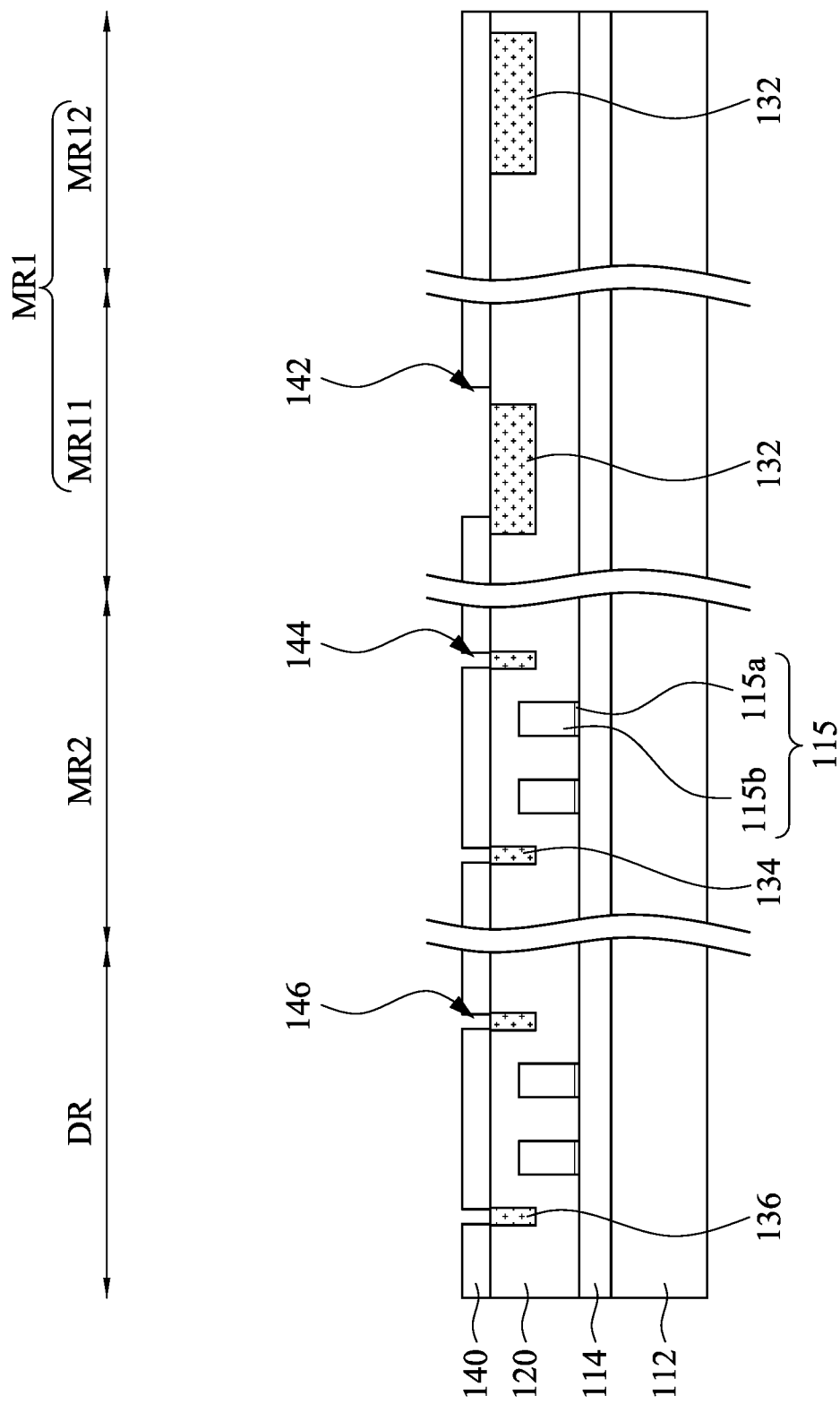

Referring to FIG. 8A, the method 500 proceeds to operation 512 where an the ILD layer is etched to form openings in the device region and mark regions. Referring to FIG. 9E, portions of the ILD layer 140 exposed by the openings PO11, PO12, and PO13 of the patterned photoresist PR1' (referring to FIG. 9D) are etched to form openings 142, 144, and 146 in the mark region MR11, MR2, and the device region DR, respectively. In some embodiments, the etching process may be a dry etching, wet etching and/or plasma etching process. For example, the etching process may employ a mixture of tetrafluoromethane ($CF_4$), trifluoromethane ($CHF_3$) and oxygen as the etching gases. After the etching process, the photoresist PR1' may be removed, for example, by oxygen plasma ashing.

Still referring to FIG. 8A, the method 500 proceeds to operation 514 where an after-etching inspection (AEI) is performed for obtaining positions of the etched pattern of the ILD layer. In some embodiments, the AEI may be performed with optical systems, such as an optical microscope, to inspect the position of the etched pattern (e.g., the opening 142) of the ILD layer 140 and the first overlay feature 132 in the region MR11. The optical microscope may not inspect the position of the opening 144 due to optical limitation. For example, an optical based image including information of the opening 142 of the ILD layer 140 and features 132 is captured during the AEI. Alternatively, in some other embodiments, the AEI may be performed with an electron-based system (e.g., the system 900 in FIG. 7) to inspect the position of the opening 142 of the ILD layer 140 and the first overlay feature 132 in the region MR11, the positions of the openings 144 of the ILD layer 140 and the first overlay feature 134 in the region MR2, and the positions of the openings 146 of the ILD layer 140 and the feature 136 in the region DR. For example, an optical or electron-based image including information of the ILD layer 140 and features 132-136 is captured during the AEI.

As the aforementioned ADI, in some embodiments, an overlay analysis is performed based on the inspection result of AEI, the overlay analysis includes determination of the overlay error between the etched ILD layer 140 and the first overlay feature 132. The overlay analysis may further include perform high order overlay analysis. In some embodiments, the controller (e.g., the controller 810 in FIG. 13) may process the inspection result, perform the overlay analysis to determine the overlay error, and perform operations according to the result of the overlay analysis. For example, the controller may improve/optimize the exposure tool (e.g., the exposure tool 820 in FIGS. 12 and 13) used for exposing the photoresist (e.g., the operation 508) based on the overlay error with consequence that correct the offset in the etch process for next coming wafer, in which the offset in the etch process may result from etching loading effect. In some embodiments where the AEI is performed with an electron-based system, the controller may perform the method M in FIG. 4 for the determination of overlay errors between the etched ILD layer 140 and the first overlay feature 132. In some other embodiments, the AEI may be omitted.

Figure 9F:
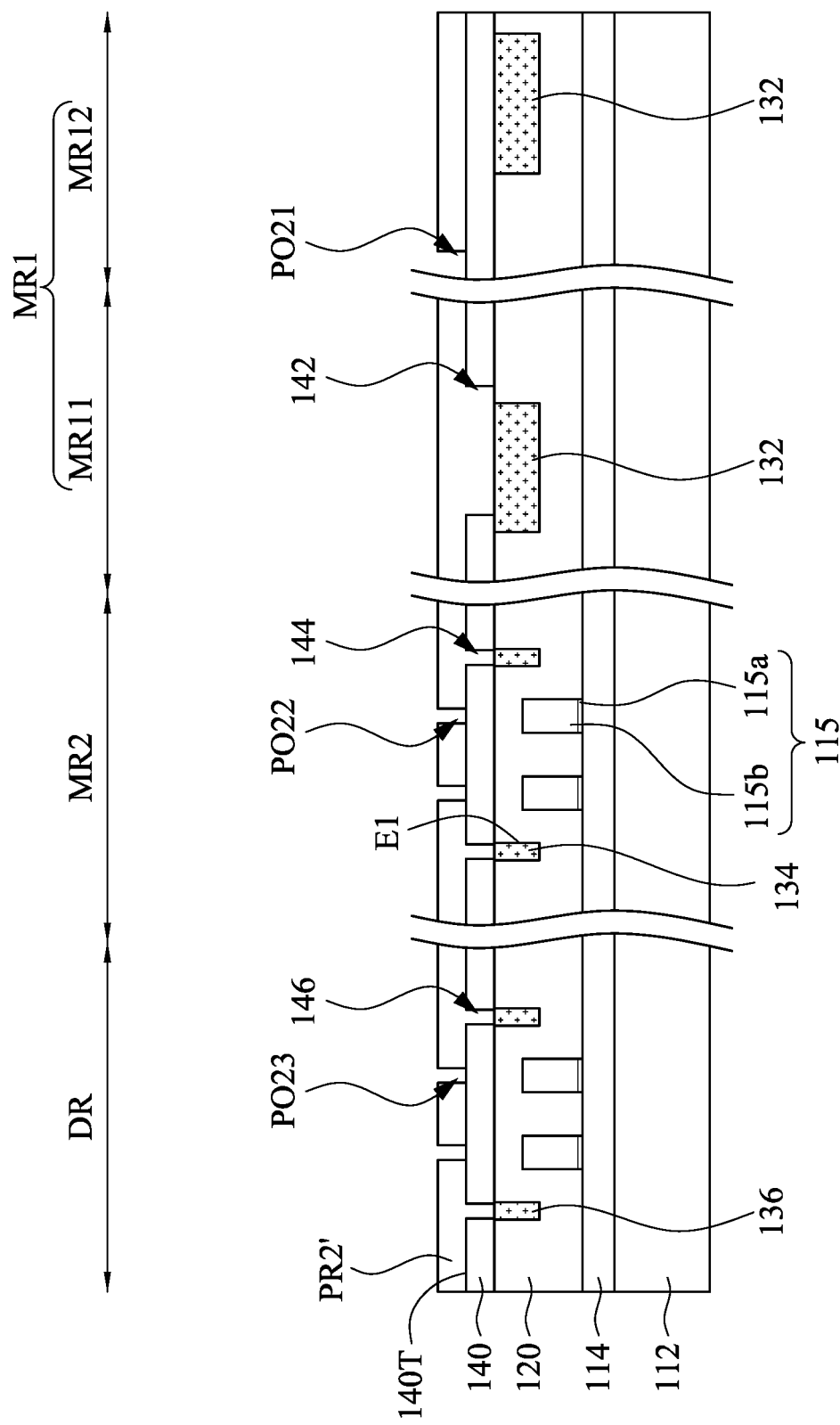

Referring to FIG. 8B, the method 500 proceeds to operation 516 where a photoresist layer is formed over the ILD layer and then be exposed and developed. Referring to FIG. 9F, the method 500 proceeds to operation 516 where a photoresist layer is formed over the structure of FIG. 9E, and portions of the photoresist layer is exposed and developed. After the exposure and development, portions of the photoresist layer are removed, and the remaining portion of the photoresist layer is referred to as photoresist PR2'. The photoresist PR2' includes openings PO21, PO22, and PO23 in the mark regions MR12, MR2, and the device region DR, respectively.

Referring to FIG. 8B, the method 500 may proceeds to operation 518 where an ADI may be performed for obtaining positions of the photoresist PR2'. In some embodiments, ADI may be performed with optical systems, such as an optical microscope, to inspect the position of the openings PO21 of the photoresist PR2' and the first overlay feature 132 in the region MR11. In some other embodiments, the ADI may be performed with an electron-based system (e.g., the system 900 in FIG. 7) to inspect the position of the openings PO21 of the photoresist PR2' and the first overlay feature 132 in the region MR11, the positions of the openings PO22 of the photoresist PR2' and the first overlay feature 134 in the region MR2, and/or the positions of the openings PO23 of the photoresist PR2' and the feature 136 in the region DR. For example, an optical or electro-based image including information of the photoresist PR2' and features 132-136 is captured during the ADI. An overlay analysis is performed based on the inspection result of ADI, the overlay analysis may include determination of the overlay error between two features (e.g., the photoresist PR2' and the first overlay feature 132), and a rework process may be initiated according to the overlay error. Other details of the ADI are similar to the ADI at operation 510, and not repeated herein.

Figure 9G:
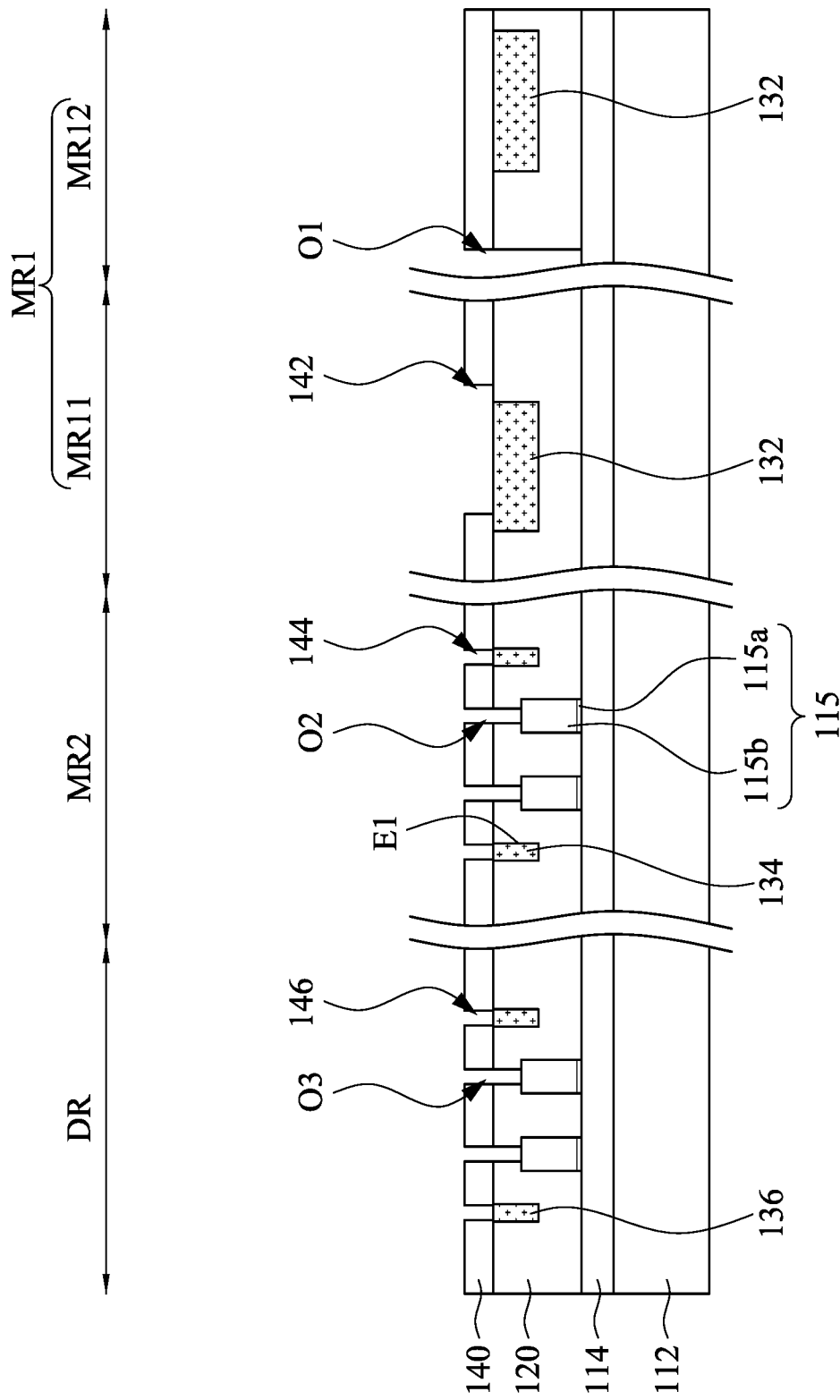

Referring to FIG. 8B, the method 500 proceeds to operation 520 where the ILD layer is etched to form openings in the device region and mark region. Referring to FIG. 9G, the method 500 proceeds to operation 520 where portions of the ILD layers 120 and 140 exposed by the openings PO21, PO22, and PO23 of the patterned photoresist PR2' (referring to FIG. 9F) are etched to form openings O1, O2 and O3 in the mark region MR12, MR2, and device region DR respectively. In some embodiments, the etching process may be a dry etching, wet etching and/or plasma etching process. For example, the etching process may employ a mixture of tetrafluoromethane ($CF_4$), trifluoromethane ($CHF_3$) and oxygen as the etching gases. After the etching process, the photoresist PR2' (referring to FIG. 9F) may be removed, for example, by oxygen plasma ashing.

Referring to FIG. 8B, the method 500 may proceeds to operation 522 where an AEI may be performed for obtaining positions of the etched pattern of the ILD layers. In some embodiments, the AEI may be performed with optical systems, such as an optical microscope, to inspect the position of the openings O1 and the first overlay feature 132 in the region MR21. Alternatively, in some other embodiments, the AEI may be performed with an electron-based system (e.g., the system 900 in FIG. 7) to inspect the position of the opening O1 and the first overlay feature 132 in the region MR11, the positions of the openings O2 and the features 134 and 154 in the region MR2, and/or the positions of the openings O3 and the features 136 and 156 in the region DR. For example, an optical or electron-based image including information of the opening O1-O3 and features 132-136, 154, and 156 is captured during the AEI. The exposure tool (e.g., the exposure tool 820 in FIGS. 13 and 14) used for exposing the photoresist may be optimized for next coming wafer according to a result of the AEI. Other details of the AEI are similar to the AEI at operation 514, and not repeated herein.

Figure 9H:
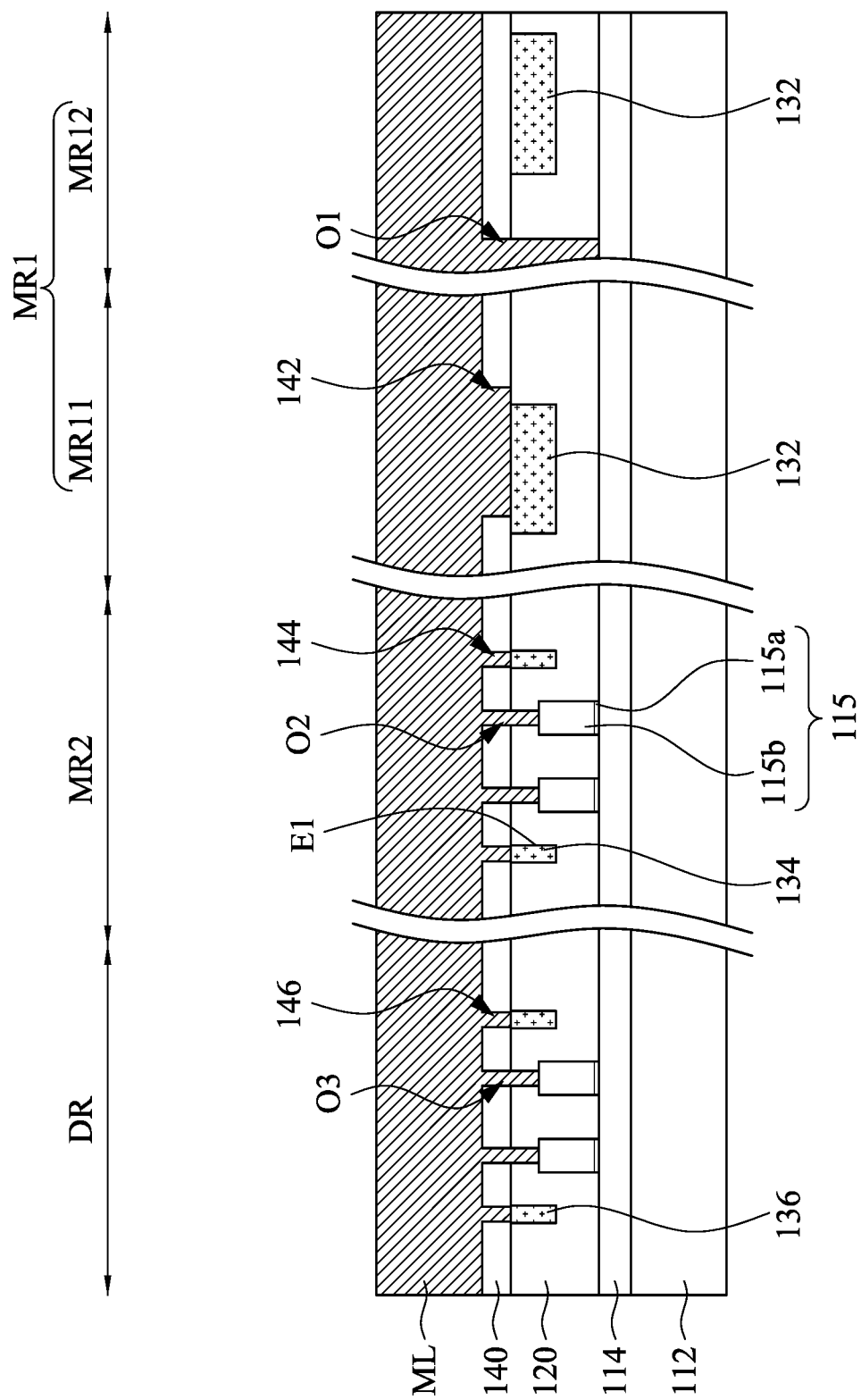

Referring to FIG. 8B, the method 500 proceeds to operation 524 where the openings of the ILD layer are overfilled with a metal material. Referring to FIG. 9H, the method 500 may proceeds to operation 524 where the openings 142-146 and O1-O3 are overfilled with a metal material ML. The metal material ML includes, for example, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials, combinations thereof, or multi-layers thereof. The metal material ML may be deposited by CVD, physical vapor deposition (PVD), sputter deposition, or other techniques suitable for depositing conductive materials. The material of the metal material ML may be the same or different from that of the features 132-136.

Figure 9I:
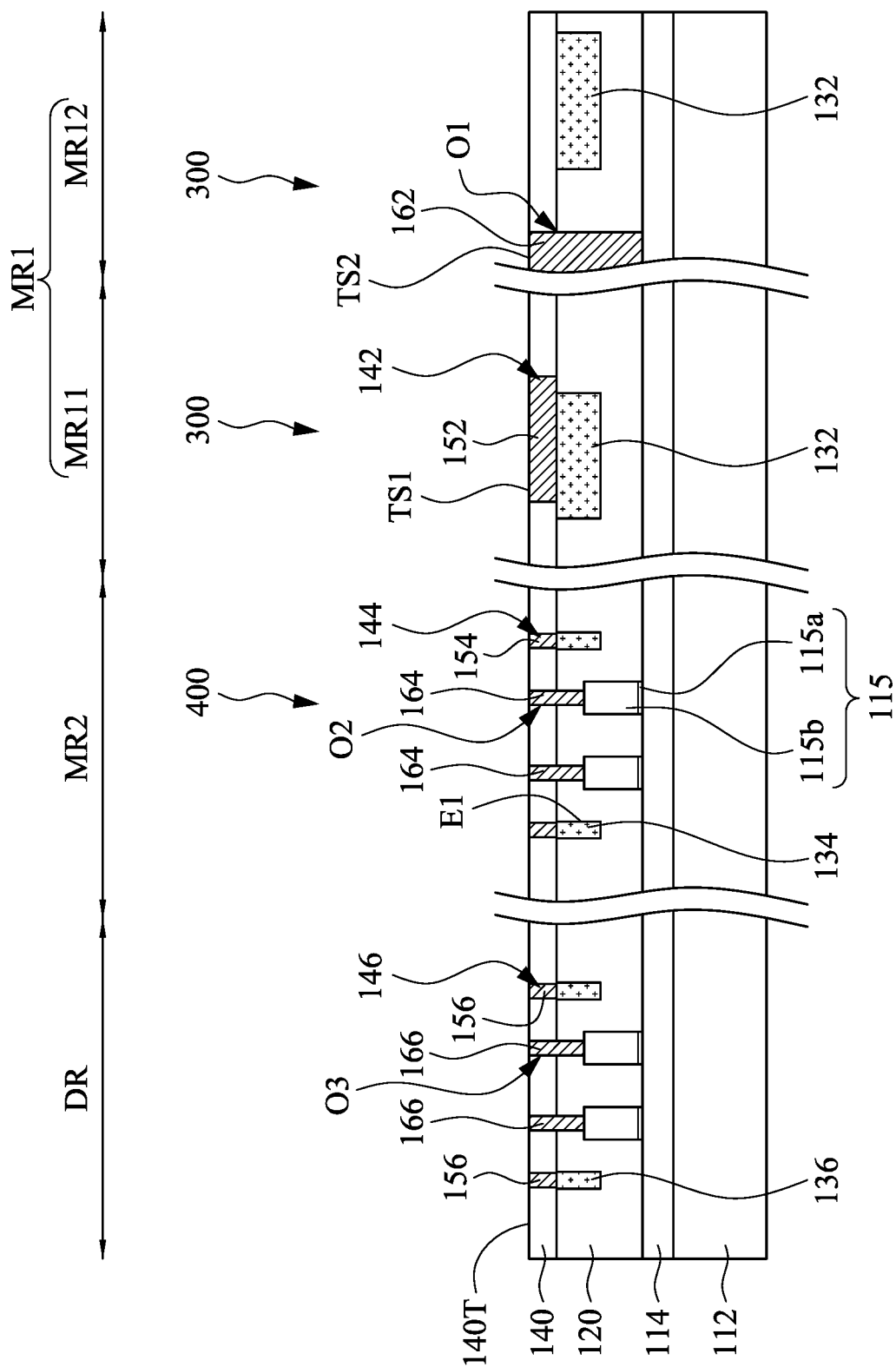

Referring to FIG. 8B, the method 500 proceeds to operation 526 where a planarization process is performed to form circuit features in the device region and overlay features in the mark regions. Referring to FIG. 9I, the method 500 may proceeds to operation 526 where a planarization process is performed to remove an excess portion of the metal material ML (referring to FIG. 9H) out of the openings 142-146 and O1-O3. The planarization process may be a chemical-mechanical polish (CMP) process that uses a slurry to chemically react with a target surface, and then removing the reacted target surface by polishing. After the planarization process, the remaining portions of the metal material ML forms second features 152, 154, and 156 in the openings 142, 144, and 146, respectively and forms second overlay features 162, 164, and 166 in the openings O1, O2 and O3, respectively. The second features 152-156 and 162-166 has top surfaces TS1 and TS2 coplanar with a top surface 140T of the ILD layer 140.

A combination of the overlay features 132 and 152 may be referred to as optical overlay marks 300 (referring to FIG. 1) in mark region MR11 in this context, and a combination of the overlay features 132 and 162 may be referred to as another optical overlay marks 300 (referring to FIG. 1) in mark region MR12 in this context. A combination of the overlay features 134, 154, and 164 may be referred to as electron-based overlay marks 400 (referring to FIG. 1) in this context. The first and second circuit features 136, 156 and 166 may form source/drain contacts, contact vias, and gate contacts connected with a device 200 (e.g., SRAM cell/devices). The electron-based overlay marks 400 are integrally formed with the source/drain contacts, the contact vias, and the gate contacts and have similar pattern and appearance. It is noted that the optical overlay marks 300 and the electron-based overlay marks 400 (referring to FIG. 1) are dummy, and not tested by Wafer Acceptance Test (WAT).

In the present embodiments, referring to FIG. 8B, the method 500 proceeds to operation 528 where an after-planarization inspection (API) is performed with an electron-based system. The electron-based system provides a higher imaging resolution than that of an optical microscope, and is suitable for detecting the small overlay features 134, 154, and 164. However, due to the coverage of the ILD layer 140, in some cases, an electron-based system used for detecting surface topography may not detect the underlying pattern, such as the first overlay feature 134. For example, an electron-based system using a low landing voltage (e.g., lower than 5 kilovolts (kV)) may be incapable of obtaining image information of the first overlay feature 134.

In the present embodiments, as shown in FIGS. 2B-2C, FIG. 7, and FIG. 9I, an electron beams B1 is incident onto a planar surface including the surfaces TS1, TS2, and 140T. The landing energy of the electron beams B1 is so high that while a portion of the electron beam may be reflected by the second overlay features 154 and 164, another portion of the electron beam may penetrate the ILD layer 140 and be reflected by the first overlay features 134, and the reflected electron beam may penetrate the ILD layer 140. Through the configuration, a see-through electron-based image includes information of the first overlay features 134 and the second overlay features 154 and 164 of the mark 400 is captured. In some embodiments, the see-through electron-based image may also include information of the gate structures 115, the source/drain features 116 (referring to FIG. 2C), and the fins 112a (referring to FIGS. 2A and 2C).

In some embodiments, an overlay analysis is performed based on the inspection result of API, the overlay analysis includes determination of the overlay error between two overlay structures (e.g., the first and second overlay features 134, 154, 164, the gate structures 115, the source/drain features, and the fins). The determination of overlay errors is exemplarity illustrated as the overlay error estimation method in FIG. 4, and not repeated herein. The overlay analysis may further include perform high order overlay analysis. To be specific, the overlay analysis determines the overlay error between the first overlay feature 134 and the second overlay feature 154, and the overlay error between the first overlay feature 136 and the second overlay feature 164 formed on the pre-layer structure 110. In some embodiments, the overlay analysis may further determine the overlay error between the fins 112a (referring to FIGS. 2A and 2C) and the gate structures 115, the fins 112a (referring to FIGS. 2A and 2C) and the epitaxial source/drain features 116 (referring to FIG. 2C), and the gate structures 115 and the epitaxial source/drain features 116 (referring to FIG. 2C).

In some cases, the CMP process may erode the top surfaces of the overlay features in the marks 300 and/or 400, such that the overlay features may be damaged during the CMP process. The damaged overlay features may result in incorrect overlay errors in the following measurements.

Figure 12:
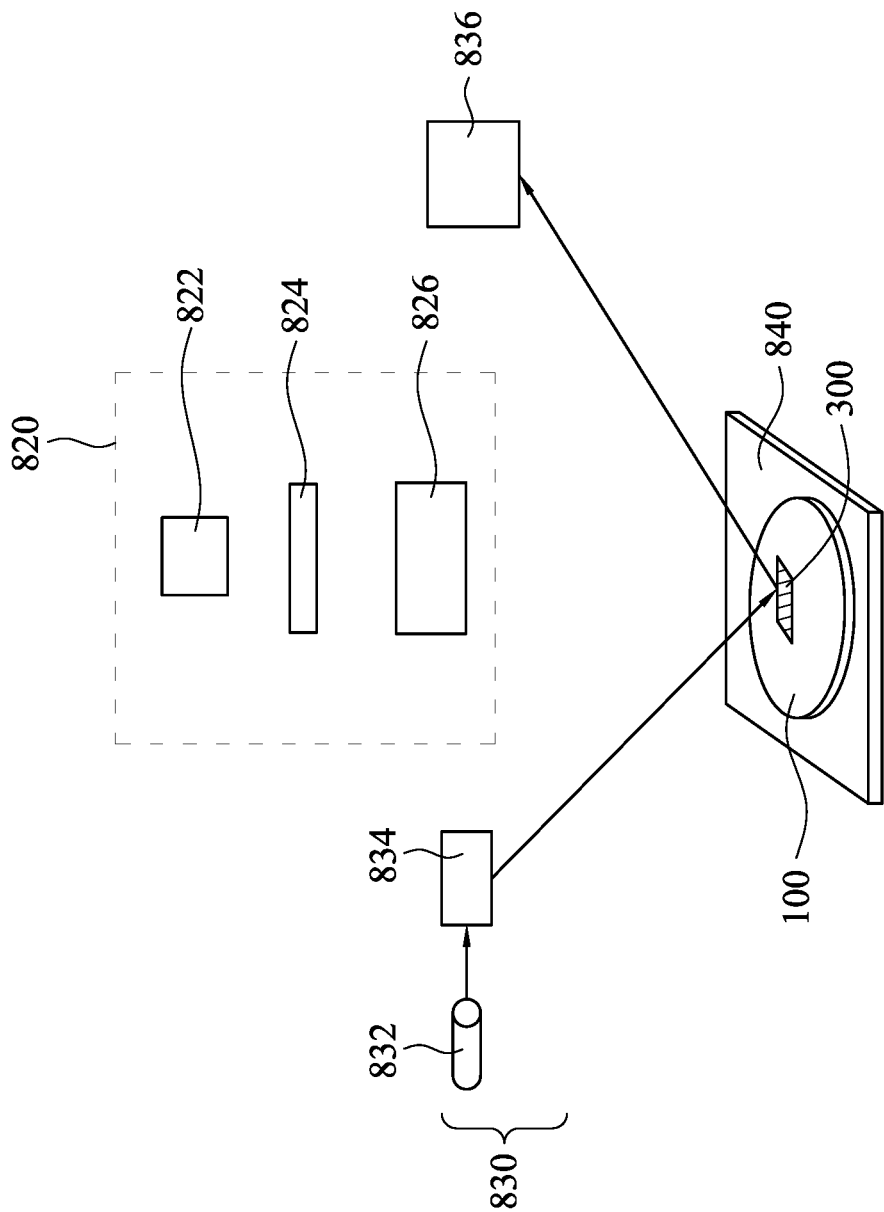
FIG. 12 is a schematic view of a lithography system including an exposure tool and an optical based system according to some embodiments of the present disclosure.
Figure 13:
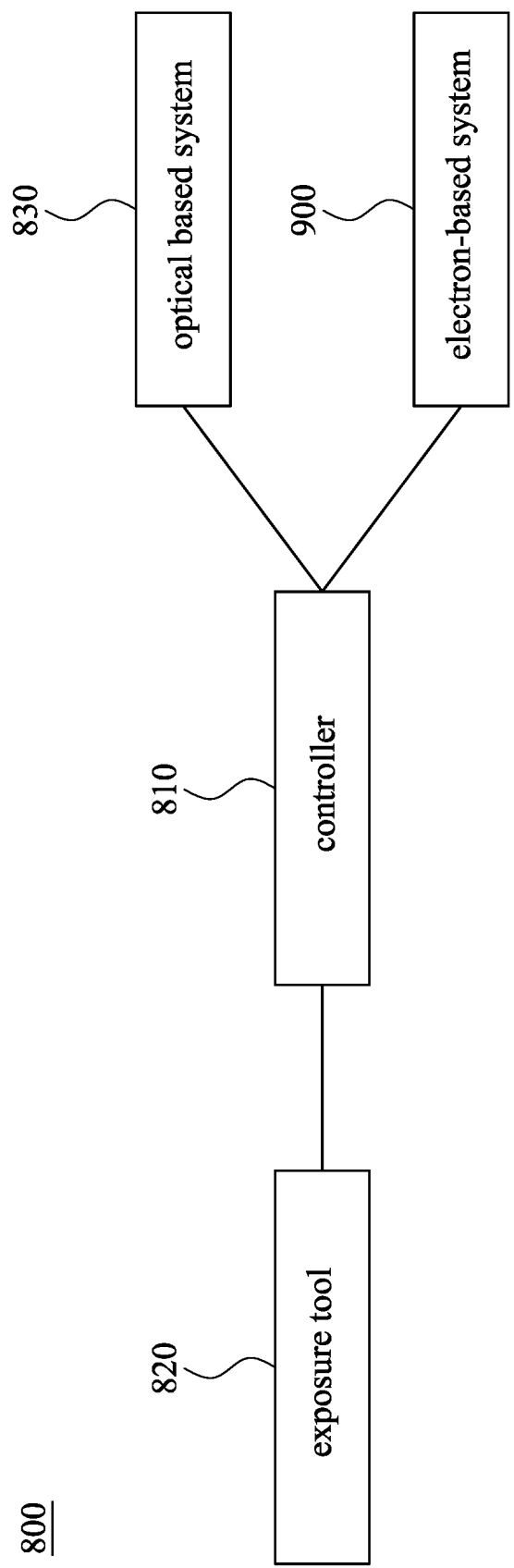
FIG. 13 is a block diagram illustrating the system for the overlay measurement and control according to some embodiments of the present disclosure.

In the present embodiments, the method 500 may proceed to operation 530 where the exposure tool 820 in FIG. 12 is adjusted according to the overlay error obtained from the API, ADI, or AEI, and then used for exposing photoresists of subsequent wafers. In the present embodiments, the overlay error obtained from API may be sent back to a computer (as shown in FIG. 13) that controlling the exposure tool (e.g., the exposure tool 820 in FIG. 12 as used in operations 508 and 516 in FIGS. 8A and 8B) with consequence that provide an offset to the overlay features, thereby improving CMP process for next coming wafer. For example, by adjusting a reticle of the exposure tool, the positions of the overlay features are compensated with an offset, thereby reducing the CMP erosion. For example, a compensation value is determined based on the overlay error, and the compensation value is implemented in the exposure tool 820 in FIG. 12 to compensate settings of the exposure tool 820 and thereby improve overlay condition between the features. For example, a position of a reticle 824 of the exposure tool 820 (referring to FIG. 12) may be adjusted according to the compensation value. The exposure tool 820 with the implemented compensation value is then used for exposing photoresists of subsequent wafers.

Although the second features 152-156 and 162-166 are formed by the same metal overfilling operation and planarization process, it should not limit the scope of the present disclosure. In some other embodiments, prior to the formation of the openings O1-O3, a metal material may overfill the openings 142-146, and a planarization process may be performed to remove excess metal material out of the openings 142-146, thereby forming the features 152-156. In such embodiments, an API may be performed after the formation of the features 152-156 and prior to the formation of the openings O1-O3. In some aspects, the openings O1-O3 may be formed prior to the formation of the openings 142-146. In such aspects, in some embodiments, the openings O1-O3 and 142-146 may be filled with metal materials to form the features 152-156 and 162-166. In such aspects, in some alternative embodiments, prior to the formation of the openings 142-146, a metal material may overfill the openings O1-O3, and a planarization process may be performed to remove excess metal material out of the openings O1-O3, thereby forming the features 162-166, in which an API may be performed after the formation of the features 162-166 and prior to the formation of the openings 142-146. In some aspects, the openings O1-O3 and the openings 142-146 may be formed by the same lithography and etching processes. In some embodiments, an additional API may be performed at the operation 502. The API may be used in observing other features, such as gate structures, fins, source/drain regions, and not limited to the exemplary conductive features.

Figure 10:
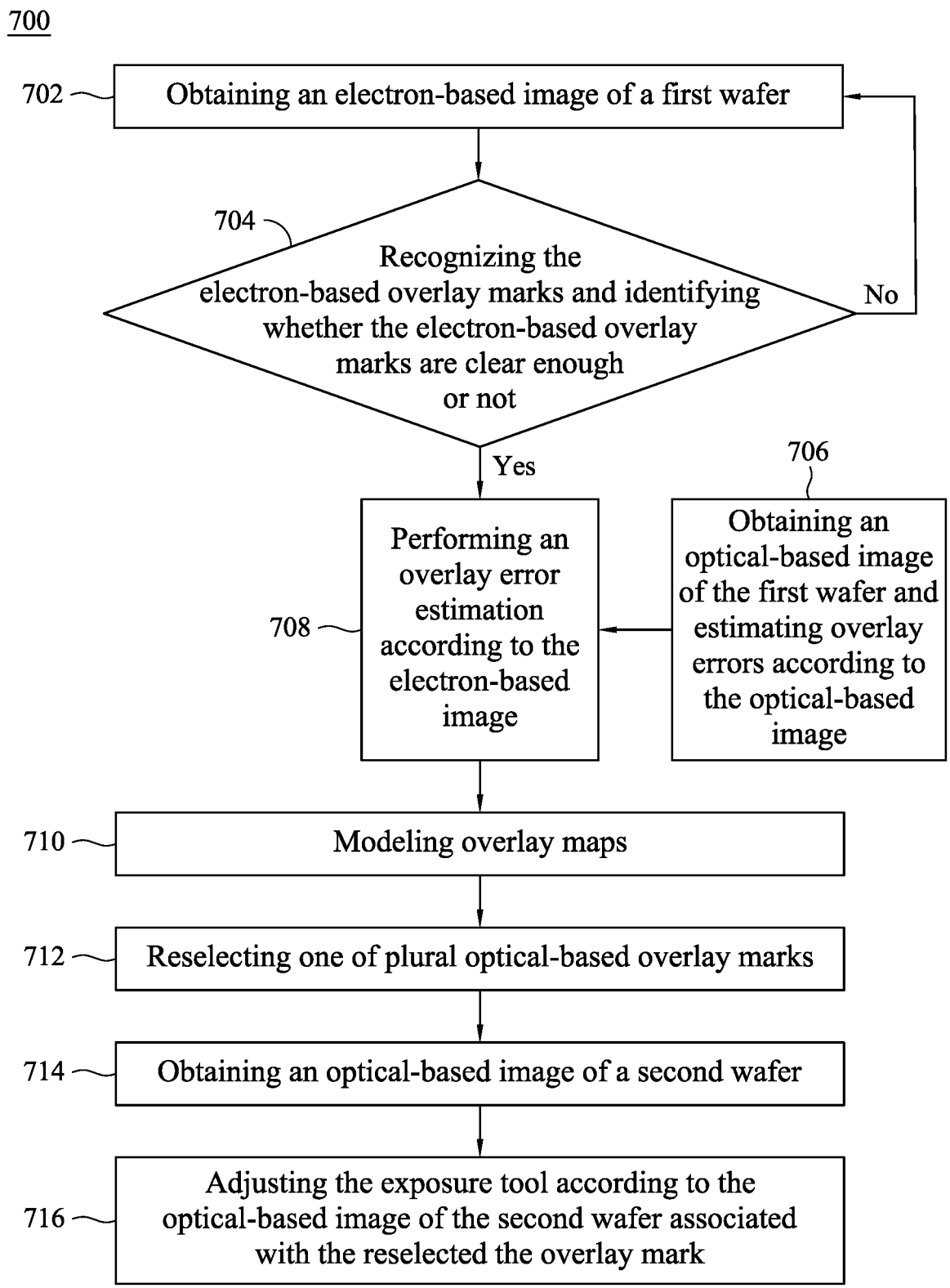
FIG. 10 is a flow chart of a method for selecting overlay mark according to some embodiments of the present disclosure.

FIG. 10 is a flow chart of a method 700 for selecting an optical overlay mark according to some embodiments of the present disclosure. The method 700 is performed for selecting one kinds of the sub-optical marks 300S1-300S9 (referring to FIG. 5A) that is less influenced by the photoresist shrinkage, the etch loading effect, mark damage, or other process effect for wafer, thereby determining the sub-selected optical mark as a standard optical mark in a fabrication process of next wafer. It is understood that additional operations may be provided before, during, and after the steps shown by FIG. 10, and some of the steps described below can be replaced or eliminated for additional embodiments of the method 700. The order of the operations/processes may be interchangeable. In some embodiments, the method 700 may be performed after the method 500 of FIGS. 8A and 8B. For example, the method 700 begins at step 702 where an electron-based image is obtained by the electron-based system 900 (referring to FIG. 7) as a result of the API, for example, in the operation 528 of FIG. 8B.

Reference is made to FIG. 9I and FIG. 10. The method 700 proceeds to step 704 where both the pattern of the first layer (e.g., the first overlay features 134) and the pattern of the second layer (e.g., the second overlay features 154 and/or 164) of the electron-based overlay mark 400 in the electron-based image are recognized. In some embodiments, the ILD layer 140 that covers the pattern of first layer (e.g., the first overlay features 134) may be too thick to transport the electrons, such that the detected pattern of the first layer (e.g., the first overlay features 134) may be much less clear than the detected pattern of the second layer (e.g., the second overlay features 154 and/or 164). If the pattern of the first layer (e.g., the first overlay features 134) is not clear enough for the recognition, the method 700 repeats step 702 for obtaining another electron-based image by tuning the electron-based system 900. For example, at least one of the condense degree, the landing voltage, and other parameters of the electron-based system 900 (referring to FIG. 7) is tuned, such that another electron-based image may be clearer than the previous electron-based image. If the pattern of first layer (e.g., the first overlay features 134) is clear enough for the recognition, the method 700 proceeds to step 706 where an overlay error estimation is performed, so as to obtain plural overlay errors at plural regions. For example, the overlay error estimation is the overlay error estimation method M which has been illustrated in FIG. 4.

The method 700 further includes a step 706 where an optical-based image is obtained by the optical-based system 830 (referring to FIG. 13) as a result of the ADI or AEI, for example, in the operations 510, 514, 518, 522 of FIGS. 8A and 8B.

The overlay errors may be determined and estimated according to positions of selected point (e.g., the positions of the pattern of first layer, such as the first overlay features 132-136) and position of the corresponding overlay structure (e.g., the pattern of the second layer such as the second overlay features 152-156 and/or 162-166, the etched ILD layer 140, or the photoresist PR1'/PR2'). Herein, for better description, the overlay errors obtained after developing/etching/planarization are referred to as ADI/AEI/API overlay errors, respectively. For example, referring to FIG. 1, each of the electron-based overlay marks 400 has an API overlay error obtained from the electron-based image, in which, for example, the method M shown in FIG. 4 may be used for determining the overlay errors. Also, referring to FIGS. 5A-5C, each of the marks 300S1 and 300S2 has an ADI/AEI overlay error obtained from the optical-based image. In some embodiments, a distance between the marks 400 and the adjacent marks 300S1/300S2 is designed to be in a range from about 0 millimeter to about 0.5 millimeter.

Figure 11A:
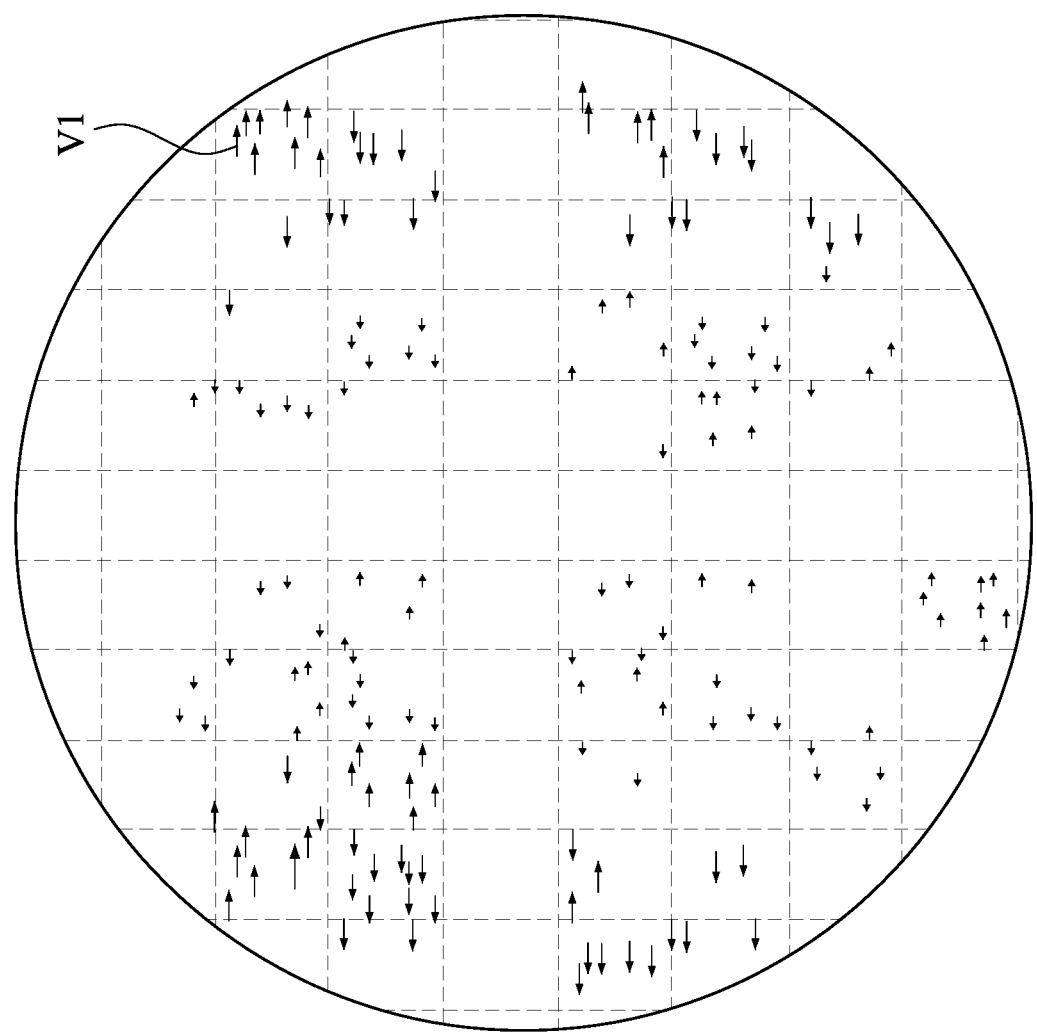
FIGS. 11A and 11B are overlay correction maps using the overlay errors measured on a wafer by different optical overlay marks according to some embodiments of the present disclosure.
Figure 11B:
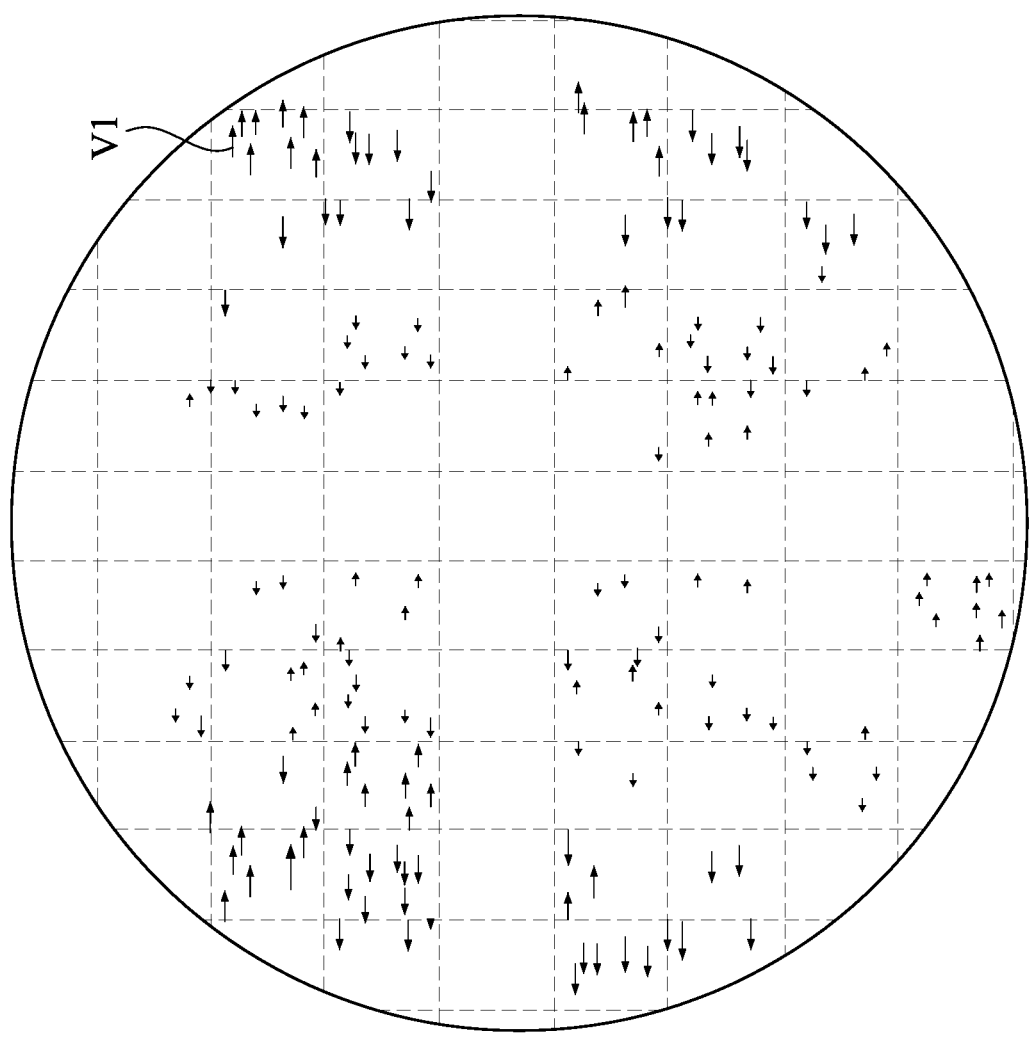
Figure 11C:
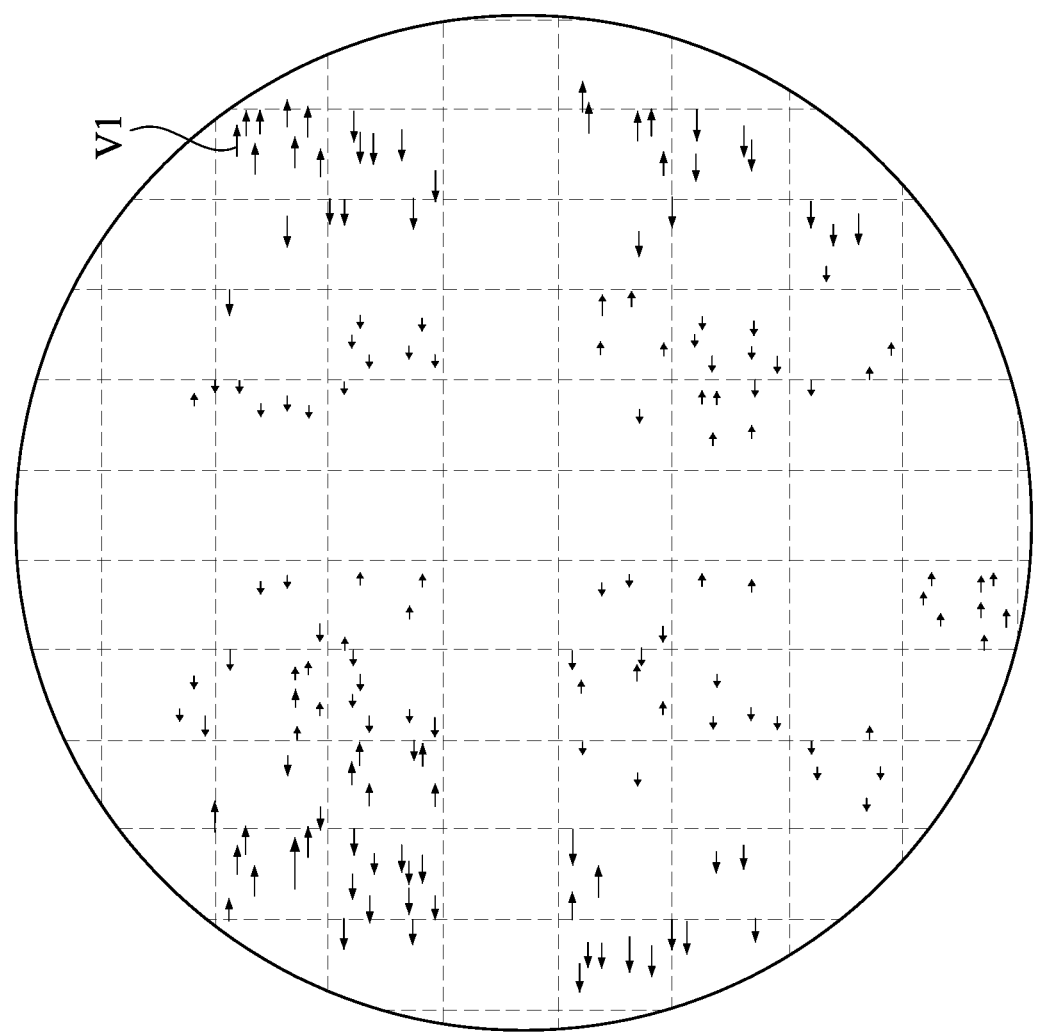
FIG. 11C is an overlay correction map using the overlay errors measured on a wafer by an electron-based overlay mark according to some embodiments of the present disclosure.

Referring to FIGS. 10 and 11A-11C, the method 700 proceeds to step 710 where overlay correction maps are modeled and demonstrated. FIGS. 11A and 11B are ADI overlay correction maps using the ADI overlay errors measured from the optical overlay marks 300S1 and 300S2 (referring to FIGS. 5A-5C) according to some embodiments of the present disclosure, respectively. FIG. 11C is an API overlay correction map using the API overlay errors measured from an electron-based overlay mark 400 according to some embodiments of the present disclosure. The overlay errors may be determined by checking if the positions of the selected points match with the positions of the corresponding overlay marks. When there is a position difference between the selected points and the corresponding overlay structure, the overlay errors may be represented using the vectors V1 illustrating the position difference and direction difference between the selected points and the corresponding overlay marks. It is noted that vectors V1 in FIG. 11A-11C are exemplarily depicted. The overlay error vectors V1 may be formed by comparing, on a point-to-point basis, the measured positions of the selected points and the positions of the corresponding overlay structure.

In some cases, the API overlay errors of the electron-based overlay marks 400 may be different from the ADI/AEI overlay error of the marks 300S1 and 300S2 adjacent to the electron-based overlay marks 400 due to the photoresist shrinkage, the etch loading effect, mark damage, or other process effect. The different configurations of the marks 300S1 and 300S2 may results in different ADI/AEI overlay errors of the marks 300S1 and 300S2.

Still referring to FIGS. 10 and 11A-11C, the method 700 proceeds step 712 where the ADI overlay correction maps of FIGS. 11A and 11B are compared with the API overlay correction map of FIG. 11C, and a target optical overlay mark is reselected based on the comparison result. For example, an API overlay error of one electron-based overlay mark 400 is respectively compared with the ADI/AEI overlay errors of the marks 300S1 and 300S2 proximate to the electron-based overlay mark 400. In the comparison process, one of the ADI overlay correction maps of FIGS. 11A and 11B similar to the API overlay correction map of FIG. 11C, is found, and the optical overlay mark corresponding to said one of the ADI overlay correction maps of FIGS. 11A and 11B is reselected for next wafer for enhancing the yield rates. For example, a correlation coefficient of the API overlay correction map of FIG. 11C and the ADI overlay correction maps of FIGS. 11A and 11B is calculated, and a relationship is built between the API overlay correction map of FIG. 11C and the ADI overlay correction maps of FIGS. 11A and 11B. In some embodiments, the relationship may be linear.

In some embodiments, for example, the ADI overlay correction map of FIG. 11B has higher correlation with the API overlay correction map than that of FIG. 11A, therefore the optical mark 300S2 used in FIG. 11B is reselected for next wafer, and vise versa. The selected mark 300S2 is believed to be less influenced by photoresist shrinkage, etch loading effect, and/or mark damage during plural fabrication processes (e.g., lithography, etching, CMP, or the like), than other sub-optical marks (e.g., the mark 300S1), such that the selected mark 300S2 is beneficial for checking the overlay condition of next wafer.

In the present embodiments, one of the sub-optical marks 300S1 and 300S2 (referring to FIGS. 5A-5C) is reselected based on the ADI and API overlay correction maps. However, it should not limit the scope of the present disclosure. In some other embodiments, the optical overlay marks 300S1/300S2 (referring to FIGS. 5A-5C) is reselected based on the AEI and API overlay correction maps. For example, two AEI overlay correction maps (not shown) are compared with the API overlay correction as shown in FIG. 11C, and one of the AEI overlay correction maps has higher correlation with the API overlay correction map than that of the other one of the AEI overlay correction maps is determined, and the optical overlay mark corresponding to said one of the AEI overlay correction maps is reselected for next wafer.

To be specific, the method 700 proceeds step 714 where another wafer is optically inspected by the optical-based system 830 (referring to FIG. 12), and thereby obtaining another optical-based image. For example, a photoresist layer is formed over the another wafer, exposed by light pattern, and developed to form plural openings in the photoresist layer. The openings in the photoresist layer are inspected by the optical-based system 830 (referring to FIG. 12), after the development, as an ADI inspection. Herein, the another wafer may include first and second optical overlay marks corresponding to the optical overlay marks 300S1 and 300S2. That is, the first and second optical overlay marks of the another wafer may have the same configuration as that of the marks 300S1 and 300S2 of the previous wafer. For clear illustration, herein, the marks 300S1 is reselected at step 712, in which the first optical overlay mark of the another wafer has the same configuration as that of the mark 300S1 of the previous wafer Herein, a portion of the another optical-based image of the first optical overlay mark corresponding to the selected optical mark 300S1 is analyzed to obtain overlay error. If the overlay error is within an acceptable range, the photoresist layer may be hard baked, and the method proceeds to following fabrication process, such as etch and planarization processes. If the overlay error is out of specification (e.g., greater than an acceptable range), the method 700 proceeds step 716 where the another wafer may be sent to rework with adjusting the exposure tool 820 (referring to FIG. 12) according to the overlay error. To be specific, a rework process may be initiated, such as removing the overlying photoresist layer from the another wafer and forming another photoresist over the another wafer with consequence that re-optimizes the exposure tool control algorithm for exposing photoresist. In some embodiments, a compensation value is determined based on the overlay error generated from the optical-based image, and the compensation is implemented in the exposure tool 820 in FIG. 12 to compensate settings of the exposure tool 820 and thereby improve overlay condition between the overlay features. For example, a position of a reticle 824 of the exposure tool 820 (referring to FIG. 12) may be adjusted according to the compensation value. The exposure tool 820 with the implemented compensation is then used for exposing photoresists of subsequent wafers.

FIG. 12 is a schematic view of a lithography system according to some embodiments of the present disclosure. The lithography system includes an exposure tool 820, an optical-based system 830, and a stage 840. The exposure tool 820 is used to perform a lithography exposure process to a resist layer coated on the wafer 100.

The exposure tool 820 includes a radiation source 822, a reticle 824, and an optical module 826. The radiation source 822 is configured to provide a radiation energy to the wafer 100. The reticle 824 is configured to provide the radiation energy from the radiation source 822 with a pattern. There may be plural different reticles 824 for providing patterns for different layers of the wafer 100. The optical module 826 is configured to modulate and direct the radiation energy having the pattern to the wafer 100.

In some embodiments, the radiation source 822 may be any radiation source suitable for exposing a resist layer. In various examples, the radiation source 822 may include a light source selected from the group consisting of ultraviolet (UV) source, deep UV (DUV) source, extreme UV (EUV) source, and X-ray source. In alternative embodiments, the radiation source 822 is an electron beam (e-beam) source for exposing a resist layer by a proper mode, such as direct writing. In such a case, the reticle 824 is not used during the exposing processes.

In some embodiments, the reticle 824 includes a transparent substrate and a patterned absorption layer. The transparent substrate may use fused silica ($SiO_2$) relatively free of defects, such as borosilicate glass and soda-lime glass. The absorption layer may include a metal film such as chromium (Cr) for absorbing light directed thereon. The absorption layer is further patterned to have one or more openings in the metal film through which a light beam may travel without being completely absorbed. In some other embodiments where the radiation source 822 generates EUV radiation, the reticle 824 is designed to have reflective mechanism. For example, the reticle 824 may include a substrate coated with tens of alternating layers of silicon and molybdenum to act as a Bragg reflector that maximizes the reflection of EUV light.

The optical module 826 may be designed to have a refractive mechanism or reflective mechanism. In a refractive mechanism, the optical module 826 includes various refractive components, such as lenses. In a reflective mechanism, the optical module 826 includes various reflective components, such as mirrors.

The optical-based system 830 measures a position information of an overlay marks 300 on the wafer 100. The overlay marks 300 herein may stand for the overlay marks 300 in FIG. 1. The stage 840 holding the wafer 100 or a stage holding the reticles 824 may move based on the aforementioned compensate values calculated and obtained from the measurement result (e.g., the aforementioned optical-based image or the aforementioned electron-based image) to reduce the overlay error in the future exposure process.

In some embodiments, referring to FIG. 12, the optical-based system 830 includes a light source 832, an optical assembly 834, and an optical detector 836. The light source 832 is configured to emit a light beam. The light source 832 may be coherent or incoherent. In some embodiments, the light source 832 is capable of emitting a visual light, an infrared light, a near-infrared (NIR) light, a far-infrared (FIR) light, a violet light, an ultra-violet (UV) light, or a combination thereof. In some embodiments, the light source 832 is a laser source such as a solid state laser source, a dye laser source, or another suitable laser source. The light beam may have one or more wavelengths and at least one of the wavelengths is suitable for overlay measurement. For example, the light beam may have a wavelength of 532 nanometer (nm), 633 nm, 780 nm, 850 nm, or a combination thereof.

In some embodiments, the optical assembly 834 includes optical components such as polarizers, lens, mirrors, beam splitters, and/or fiber optics. The optical assembly 834 receives the light beam from the light source 832 and projects a modulated light beam onto a target device (such as a wafer 100), positioned on a substrate stage 840.

In some embodiments, the substrate stage 840 is operable to move such that the modulated light beam scans through one or more overlay marks 300. The modulated light beam reflected off the overlay marks 300, carries imaging information about the overlay marks 300. The light beam is collected by the optical detector 836 for overlay analysis. In some embodiments, the optical detector 836 includes light sensors and other optical components such as lens, beam splitters, and/or cameras.

FIG. 13 is a block diagram illustrating the system 800 for the overlay measurement and control according to some embodiments of the present disclosure. The system 800 includes the controller 810 (e.g., computer), the exposure tool 820 (also shown in FIG. 12), the optical based system 830 (also shown in FIG. 12), and the electron-based system 900 (also shown in FIG. 7). The controller 810 is coupled with the exposure tool 820, the optical based system 830, and the electron-based system 900. For example, the controller 810 is electrically connected to the particle source 910, the scanner 930, the wafer stage 940, and the detector 950 of the electron-based system 900 (referring to FIG. 7). The controller 810 is for calculating overlay measurements based on the optical images obtained from the system 830, calculating overlay measurements based on the electron-based images obtained from the electron-based system 900, and adjusting the exposure tool 820 based on these overlay measurements. In some embodiments, the controller 810 performs the method M for determining the overlay errors of the electron-based overlay marks as shown in FIG. 4. In some embodiments, the controller 810 performs the method 700 for selecting the overlay mark 300 for next wafer as shown in FIG. 10.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that both underlying features and upper features are detected in one electron-based image by the electron-based system using a high landing voltage for the overlay measurements. Another advantage is that the electron-based overlay mark having underlying features and upper features for the overlay measurements has a small size for intra-field distribution. Another advantage is that the patterns of the electron-based overlay mark may be dummy and integrated formed with the circuit patterns. Another advantage is that the overlay measurements is performed at AEI/API stages for obtaining clear and complete view of overlay error and further offset corrections, which is directly related to yield enhancement. Still another advantage is that an overlay reference standard for inline overlay correction mapping and control is generated, for example, at ADI, and the overlay compensation is earlier than PFA (physical failure analysis), thereby preventing large loss due of PFA failure and saving times.

According to some embodiments of the present disclosure, a method includes forming at least one first overlay feature in a first dielectric layer over a first wafer; forming a second dielectric layer over the first overlay feature and the first dielectric layer; forming at least one opening in the second dielectric layer by at least using an exposure tool; forming at least one second overlay feature in the opening of the second dielectric layer, such that a first edge of the first overlay feature is covered by the second dielectric layer; directing an electron beam to the first and second overlay features and the second dielectric layer; detecting the electron beam reflected from the first overlay feature through the second dielectric layer and from the second overlay feature by a detector; obtaining, by a controller, at least one overlay error between the first overlay feature and the second overlay feature according to the reflected electron beam electrically connected to the detector According to some embodiments of the present disclosure, a method includes capturing a plurality of reference electron-based images of a plurality of portions of a reference mark of a semiconductor structure by a detector; obtaining, by a controller, a plurality of reference overlay errors respectively corresponding to the portions of the reference mark connected to the detector; developing, by the controller, an inference model according to the reference electron-based images and the reference overlay errors; capturing an electron-based image of an overlay mark of the semiconductor structure; determining, by the controller, an estimated overlay error corresponding to the overlay mark from the electron-based image using the inference model.

According to some embodiments of the present disclosure, a method includes capturing, by an optical detector, an optical image of a first optical mark and a second optical mark on a first wafer; obtaining, by a controller, a first overlay error of the first optical mark and a second overlay error of the second optical mark from the optical image; capturing, by an electron beam detector, an electron-based image of an electron-based mark on the first wafer; obtaining, by the controller, a third overlay error of the electron-based mark from the electron-based image; determining, by the controller, the first optical mark as a standard optical mark by comparing the first overlay error and the second overlay error with the third overlay error, wherein a correlation between the first overlay error and the third overlay error is higher than a correlation between the second overlay error and the third overlay error; and using, by the controller, a third optical mark of a second wafer as a standard optical mark for a semiconductor process on the second wafer, wherein the third optical mark of the second wafer has the same configuration as the first optical mark of the first wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming at least one first overlay feature in a first dielectric layer over a first wafer;
    forming a second dielectric layer over the first overlay feature and the first dielectric layer;
    forming at least one opening in the second dielectric layer;
    after forming the opening in the second dielectric layer, forming at least one second overlay feature in the opening of the second dielectric layer, such that a first edge of the first overlay feature is not covered by the second overlay feature;
    directing an electron beam to the first and second overlay features;
    detecting, by a detector, the electron beam reflected from the first overlay feature through the second dielectric layer and from the second overlay feature; and
    obtaining, by a controller electrically connected to the detector, at least one overlay error between the first overlay feature and the second overlay feature according to the reflected electron beam.

2. The method of claim 1, further comprising:
    determining, by the controller, a compensation value according to the overlay error; and
    adjusting an exposure tool according to the compensation value, wherein forming the opening in the second dielectric layer is performed by an exposure process using the exposure tool and a development process.

3. The method of claim 1, further comprising:
    forming a plurality of first optical-based marks in the first and second dielectric layers;
    determining, by the controller, one of the first optical-based marks as a standard optical mark according to a plurality of the overlay errors between a plurality of the first overlay feature and a plurality of the second overlay feature;
    determining, by the controller, a compensation value based on a second optical-based mark over a second wafer, wherein the second optical-based mark has the same configuration as the standard optical mark; and
    adjusting an exposure tool according to the compensation value, wherein forming the opening in the second dielectric layer is performed by an exposure process using the exposure tool and a development process.

4. The method of claim 1, wherein directing the electron beam is performed such that the electron beam is incident on a surface of the second dielectric layer and a surface of the second overlay feature, wherein the surface of the second dielectric layer and the surface of the second overlay feature are coplanar.

5. The method of claim 1, wherein forming the second overlay feature in the opening of the second dielectric layer comprises:
    overfilling the opening in the second dielectric layer with a conductive material;
    and planarizing the conductive material to form the second overlay feature.

6. The method of claim 1, wherein forming the second overlay feature in the opening of the second dielectric layer is performed such that at least a second edge of the first overlay feature is not covered by the second overlay feature, wherein the second edge of the first overlay feature extends along a direction different from a direction that the first edge of the first overlay feature extends along.

7. The method of claim 1, wherein directing the electron beam is performed such that the electron beam has a landing energy greater than 10 eV.

8. The method of claim 1, wherein forming the first overlay feature in the first dielectric layer is perform such that the first overlay feature is connected to a source/drain feature of a transistor.

9. The method of claim 8, wherein forming the second overlay feature in the opening of the second dielectric layer is performed such that the second overlay feature is connected to the first overlay feature.

10. The method of claim 1, wherein forming the second overlay feature in the opening of the second dielectric layer is performed such that the second overlay feature is connected to a gate electrode of a transistor.

11. A method for overlay error estimation, comprising:
forming a dielectric layer over a semiconductor substrate;
forming a reference mark and an overlay mark in the dielectric layer to form a semiconductor structure, wherein the overlay mark comprises an overlay feature in the dielectric layer, and the overlay feature and the dielectric layer have an interface therebetween;
capturing, by a detector, a plurality of reference electron-based images of a plurality of portions of the reference mark of the semiconductor structure;
obtaining, by a controller, a plurality of reference overlay errors respectively corresponding to the portions of the reference mark;
developing, by the controller, an inference model according to the reference electron-based images and the reference overlay errors;
capturing, by the detector, an electron-based image of the overlay mark of the semiconductor structure; and
determining, by the controller, an estimated overlay error corresponding to the overlay mark from the electron-based image using the inference model.

12. The method of claim 11, wherein obtaining the reference overlay errors is performed such that the controller receives a datasheet comprising the reference overlay errors respectively corresponding to the portions of the reference mark.

13. The method of claim 11, wherein at least one of capturing the reference electron-based images and capturing the electron-based image comprises:
directing an electron beam onto the semiconductor structure; and
detecting a reflected beam from the semiconductor structure.

14. The method of claim 11, further comprising:
adjusting an exposure tool according to the estimated overlay error.

15. The method of claim 14, further comprising:
determining, by the controller, a compensation value according to the estimated overlay error, wherein adjusting the exposure tool is performed with the compensation value.

16. A method, comprising:
capturing, by an optical detector, an optical image of at least one first optical mark and at least one second optical mark on a first wafer;
obtaining, by a controller, at least one first overlay error of the first optical mark and at least one second overlay error of the second optical mark from the optical image;
capturing, by an electron beam detector, at least one electron-based image of at least one electron-based mark on the first wafer;
obtaining, by the controller, at least one third overlay error of the electron-based mark from the electron-based image;
determining, by the controller, the first optical mark as a standard optical mark by comparing the first overlay error and the second overlay error with the third overlay error, wherein a correlation between the first overlay error and the third overlay error is higher than a correlation between the second overlay error and the third overlay error; and
using, by the controller, at least one third optical mark of a second wafer as a standard optical mark for a semiconductor process on the second wafer, wherein the third optical mark of the second wafer has the same configuration as the first optical mark of the first wafer.

17. The method of claim 16, wherein using the third optical mark of the second wafer as the standard optical mark for the semiconductor process on the second wafer comprises:
adjusting a position of a reticle of an exposure tool with respect to the third optical mark.

18. The method of claim 16, wherein a size of the electron-based mark is smaller than a size of one of the first optical mark and the second optical mark.

19. The method of claim 16, further comprising:
generating, by the controller, first and second overlay maps corresponding to a plurality of the first overlay errors of a plurality of the first optical marks and a plurality of the second overlay errors of a plurality of the second optical marks, respectively, after obtaining the first overlay errors and the second overlay errors.

20. The method of claim 16, further comprising:
generating, by the controller, an electron beam overlay map corresponding to a plurality of the third overlay errors of a plurality of the electron-based marks after obtaining the third overlay errors.

* * * * *